US010396053B2

(12) United States Patent
Fillion et al.

(10) Patent No.: US 10,396,053 B2
(45) Date of Patent: Aug. 27, 2019

(54) SEMICONDUCTOR LOGIC DEVICE AND SYSTEM AND METHOD OF EMBEDDED PACKAGING OF SAME

(71) Applicant: General Electric Company, Schenectady, NY (US)

(72) Inventors: Raymond Albert Fillion, Niskayuna, NY (US); Kaustubh Ravindra Nagarkar, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/816,396

(22) Filed: Nov. 17, 2017

(65) Prior Publication Data
US 2019/0157233 A1 May 23, 2019

(51) Int. Cl.
*H01L 23/00* (2006.01)
*H01L 23/50* (2006.01)

(52) U.S. Cl.
CPC .............. *H01L 24/20* (2013.01); *H01L 23/50* (2013.01); *H01L 24/03* (2013.01); *H01L 24/06* (2013.01); *H01L 24/19* (2013.01); *H01L 24/13* (2013.01); *H01L 2224/0231* (2013.01); *H01L 2224/02331* (2013.01); *H01L 2224/02379* (2013.01); *H01L 2224/0603* (2013.01); *H01L 2224/06131* (2013.01); *H01L 2224/13024* (2013.01); *H01L 2224/211* (2013.01);
(Continued)

(58) Field of Classification Search
CPC ......... H01L 24/20; H01L 24/19; H01L 24/06; H01L 24/03; H01L 23/50; H01L 24/13; H01L 2924/37001; H01L 2924/1431; H01L 2924/20756; H01L 2924/20758; H01L 2224/0603; H01L 2224/11; H01L 2224/06131; H01L 2224/02379; H01L 2224/0231; H01L 2224/13024
USPC .................................................. 257/774, 773
See application file for complete search history.

(56) References Cited

U.S. PATENT DOCUMENTS 5,341,564 A   8/1994 Akhavain et al.
5,353,498 A   10/1994 Fillion et al.
(Continued)

OTHER PUBLICATIONS

Tanaka et al., "Thinner and Miniature Embedded Device Package, MCeP, for PoP and Module Application", Shinko Electric Industries Co., Ltd., 45th International Symposium on Microelectronics, Sep. 9-13, 2012, San Diego, CA, pp. 001010-001017.
(Continued)

*Primary Examiner* — Alexander O Williams
(74) *Attorney, Agent, or Firm* — Ziolkowski Patent Solutions Group, SC

(57) ABSTRACT

A reconfigured semiconductor logic device includes a semiconductor logic device comprising an active surface having a plurality of input/output (I/O) pads formed thereon and a redistribution layer. The redistribution layer includes an insulating layer disposed on the active surface of the semiconductor logic device and a patterned conductive layer comprising a plurality of discrete terminal pads formed atop the insulating layer. The plurality of discrete terminal pads are electrically coupled to respective I/O pads of the plurality of I/O pads by conductive vias formed through the insulating layer. The plurality of discrete terminal pads are larger than the plurality of I/O pads.

18 Claims, 14 Drawing Sheets

(52) U.S. Cl.
CPC .............. *H01L 2924/1431* (2013.01); *H01L 2924/20756* (2013.01); *H01L 2924/20757* (2013.01); *H01L 2924/20758* (2013.01); *H01L 2924/37001* (2013.01)

(56) References Cited

U.S. PATENT DOCUMENTS

| | | | |
|---|---|---|---|
| 5,774,340 | A | 6/1998 | Chang et al. |
| 5,841,193 | A | 11/1998 | Eichelberger |
| 5,888,837 | A | 3/1999 | Fillion et al. |
| 5,946,546 | A | 8/1999 | Fillion et al. |
| 6,008,534 | A | 12/1999 | Fulcher |
| 6,172,526 | B1 | 1/2001 | Iwasaki |
| 6,242,282 | B1 | 6/2001 | Fillion et al. |
| 7,514,767 | B2 | 4/2009 | Yang |
| 7,662,667 | B2 | 2/2010 | Shen |
| 7,674,655 | B2 | 3/2010 | Chua et al. |
| 7,847,404 | B1 | 12/2010 | Schwegler et al. |
| 7,932,744 | B1 | 4/2011 | Greene et al. |
| 8,008,125 | B2 | 8/2011 | McConnelee et al. |
| 8,093,722 | B2 | 1/2012 | Chen et al. |
| 8,114,708 | B2 | 2/2012 | McConnelee et al. |
| 8,163,596 | B2 | 4/2012 | Kapusta et al. |
| 8,664,044 | B2* | 3/2014 | Jin .................. H01L 21/76283 257/700 |
| 8,759,964 | B2 | 6/2014 | Pu et al. |
| 8,779,601 | B2 | 7/2014 | Gan et al. |
| 8,916,481 | B2 | 12/2014 | Gan et al. |
| 8,927,412 | B1 | 1/2015 | Lin et al. |
| 9,018,969 | B2 | 4/2015 | Ishikawa et al. |
| 9,129,981 | B2 | 8/2015 | Yap et al. |
| 9,281,286 | B1 | 3/2016 | Yap et al. |
| 9,318,429 | B2 | 4/2016 | Hu et al. |
| 9,432,298 | B1 | 8/2016 | Smith |
| 9,520,372 | B1 | 12/2016 | Jeng et al. |
| 9,543,224 | B1 | 1/2017 | Meyer et al. |
| 9,548,240 | B2* | 1/2017 | Lin .................. H01L 21/76879 |
| 9,761,565 | B2 | 9/2017 | Vincent et al. |
| 9,793,230 | B1 | 10/2017 | Yu et al. |
| 9,837,359 | B1 | 12/2017 | Chiu et al. |
| 9,972,536 | B2 | 5/2018 | Yoshida et al. |
| 2003/0049886 | A1* | 3/2003 | Salmon ............. H01L 23/49811 438/106 |
| 2003/0209731 | A1 | 11/2003 | Ali et al. |
| 2004/0092141 | A1* | 5/2004 | Salmon ............... H01L 21/6835 439/91 |
| 2005/0156616 | A1 | 7/2005 | Morishita et al. |
| 2006/0022353 | A1 | 2/2006 | Ajuria et al. |
| 2006/0170093 | A1 | 8/2006 | Pendse |
| 2006/0185895 | A1 | 8/2006 | Kalidas |
| 2007/0075734 | A1 | 4/2007 | Ramos et al. |
| 2008/0083936 | A1 | 4/2008 | Huynh et al. |
| 2008/0096710 | A1 | 4/2008 | Souca |
| 2008/0104554 | A1 | 5/2008 | Kobayashi et al. |
| 2008/0142071 | A1 | 6/2008 | Dorn et al. |
| 2008/0237828 | A1 | 10/2008 | Yang |
| 2009/0294938 | A1 | 12/2009 | Chen |
| 2010/0025242 | A1 | 2/2010 | Pamula et al. |
| 2010/0117228 | A1 | 5/2010 | Yamamichi et al. |
| 2010/0127406 | A1 | 5/2010 | Higuchi |
| 2011/0121445 | A1 | 5/2011 | Mori et al. |
| 2012/0032314 | A1 | 2/2012 | Chen et al. |
| 2012/0328235 | A1 | 12/2012 | Christensen et al. |
| 2013/0040423 | A1* | 2/2013 | Tung .................. H01L 23/3114 438/107 |
| 2013/0127069 | A1 | 5/2013 | Boday et al. |
| 2013/0139122 | A1 | 5/2013 | Pell et al. |
| 2013/0161833 | A1* | 6/2013 | Pendse ............. H01L 23/49816 257/777 |
| 2014/0110856 | A1 | 4/2014 | Lin |
| 2014/0210068 | A1 | 7/2014 | Bartley et al. |
| 2014/0374877 | A1 | 12/2014 | Oh et al. |
| 2016/0079205 | A1 | 3/2016 | Lin et al. |
| 2016/0307872 | A1 | 10/2016 | Chen et al. |
| 2017/0084596 | A1 | 3/2017 | Scanlan |
| 2017/0092575 | A1 | 3/2017 | Manusharow et al. |
| 2017/0116366 | A1 | 4/2017 | Seo et al. |
| 2017/0141053 | A1 | 5/2017 | Chen et al. |
| 2017/0373041 | A1 | 12/2017 | Kim et al. |
| 2018/0130732 | A1* | 5/2018 | Tuominen ........... H01L 21/4853 |
| 2018/0130747 | A1* | 5/2018 | Tuominen ........... H01L 23/5383 |
| 2018/0218983 | A1 | 8/2018 | Chen et al. |

OTHER PUBLICATIONS

Shen et al., "Design of On-Chip Microwave Filters in Integrated Fan-Out Wafer Level Packaging (InFO-WLP Technology", National Taiwan University, Tiawan, APEMC Conference 2015 IEEE, pp. 1-3.

* cited by examiner

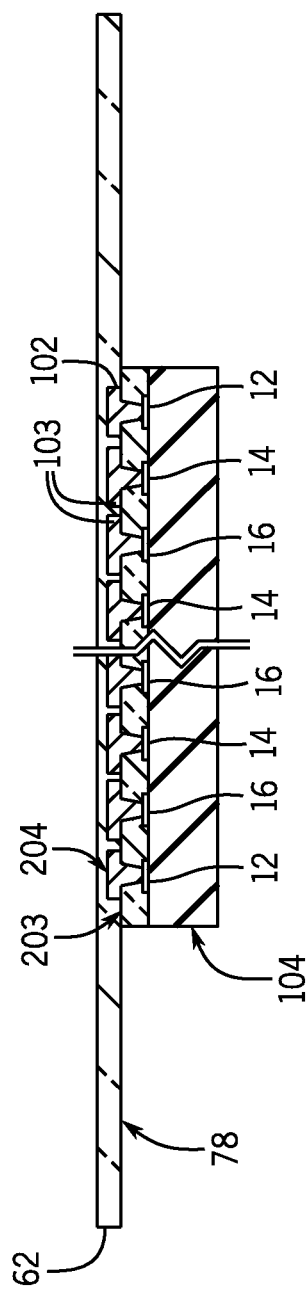
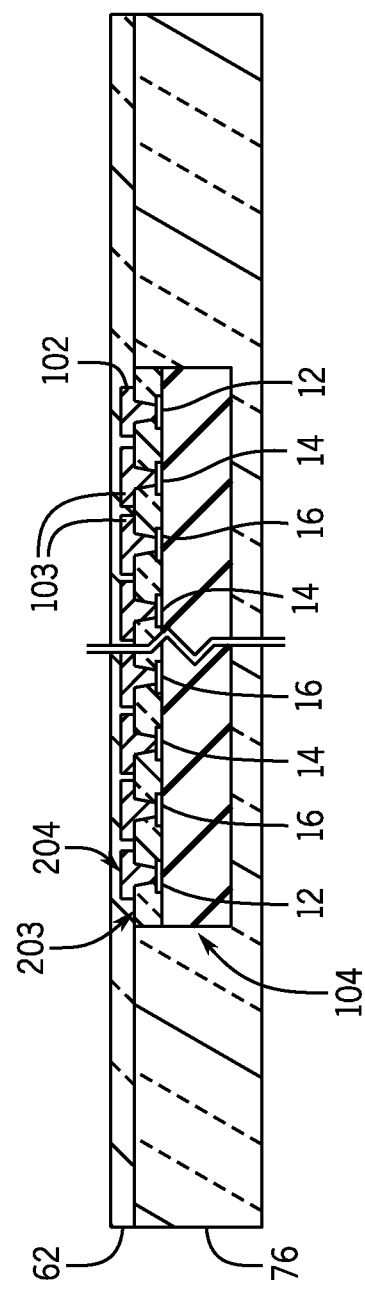

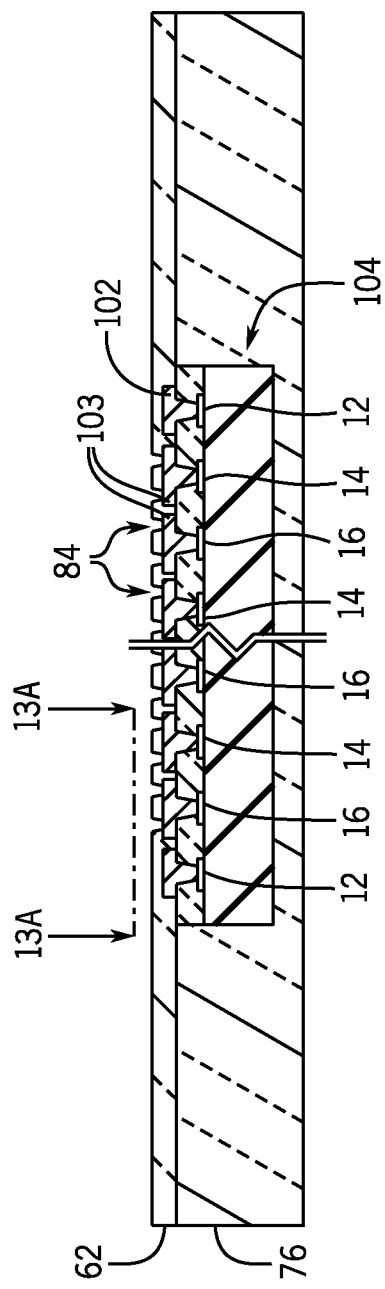
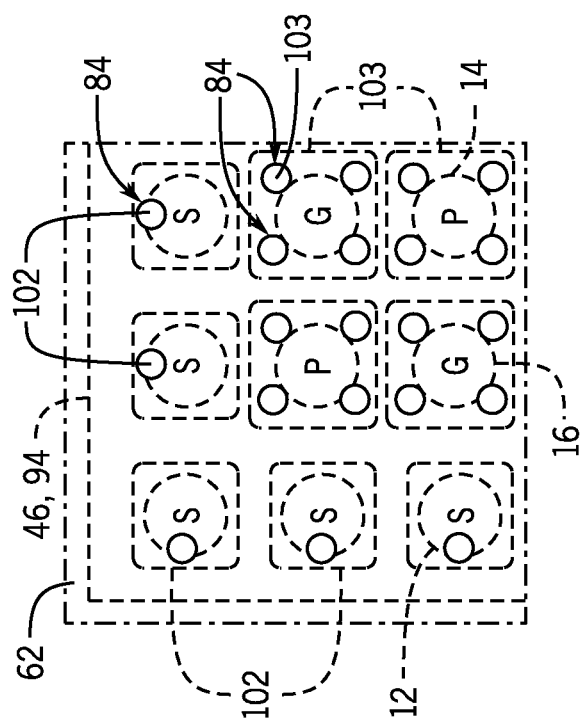
FIG. 13
FIG. 13A

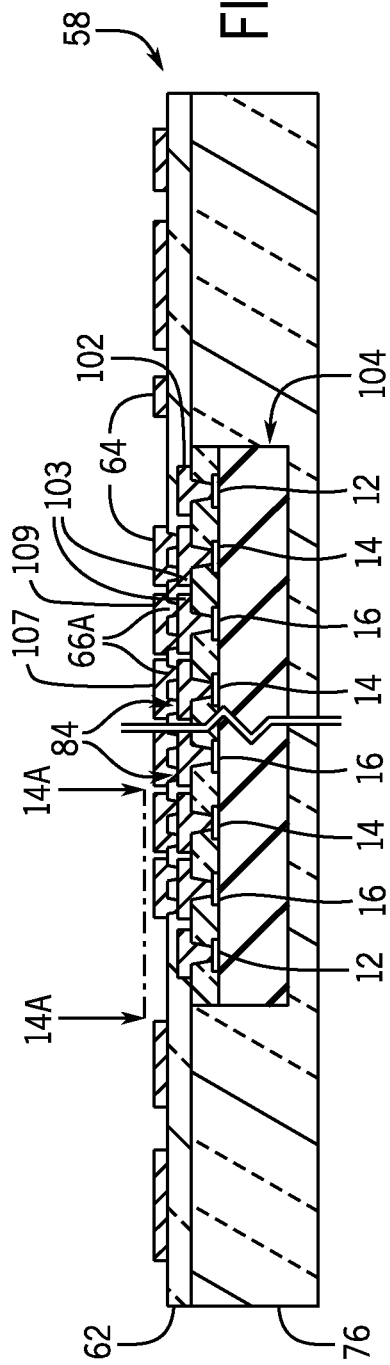
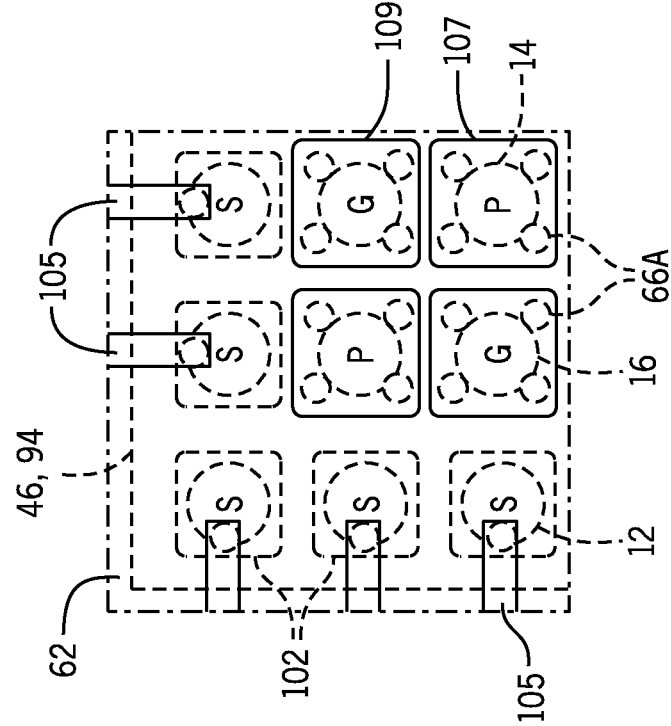
FIG. 14
FIG. 14A

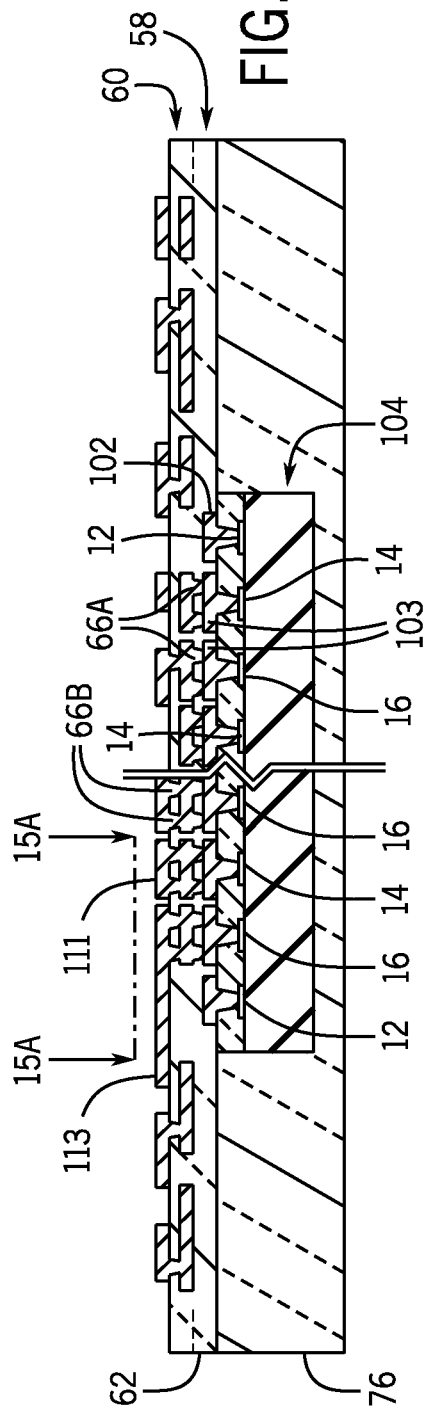
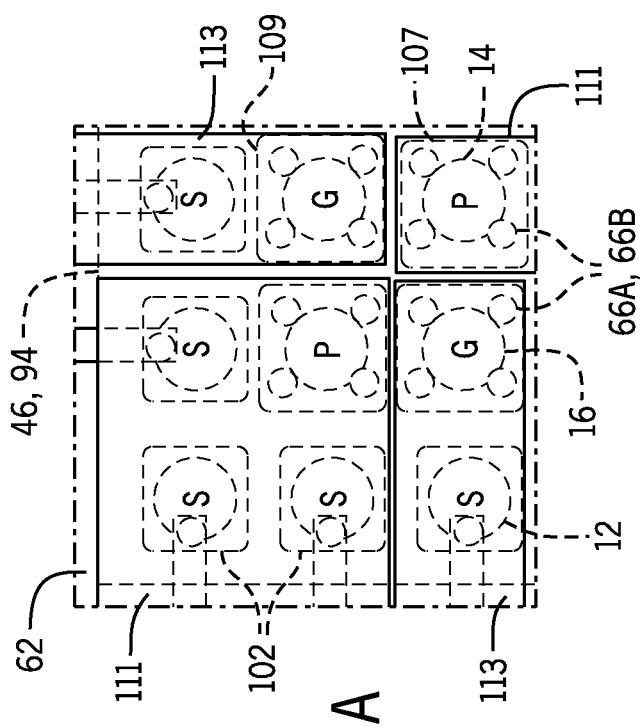

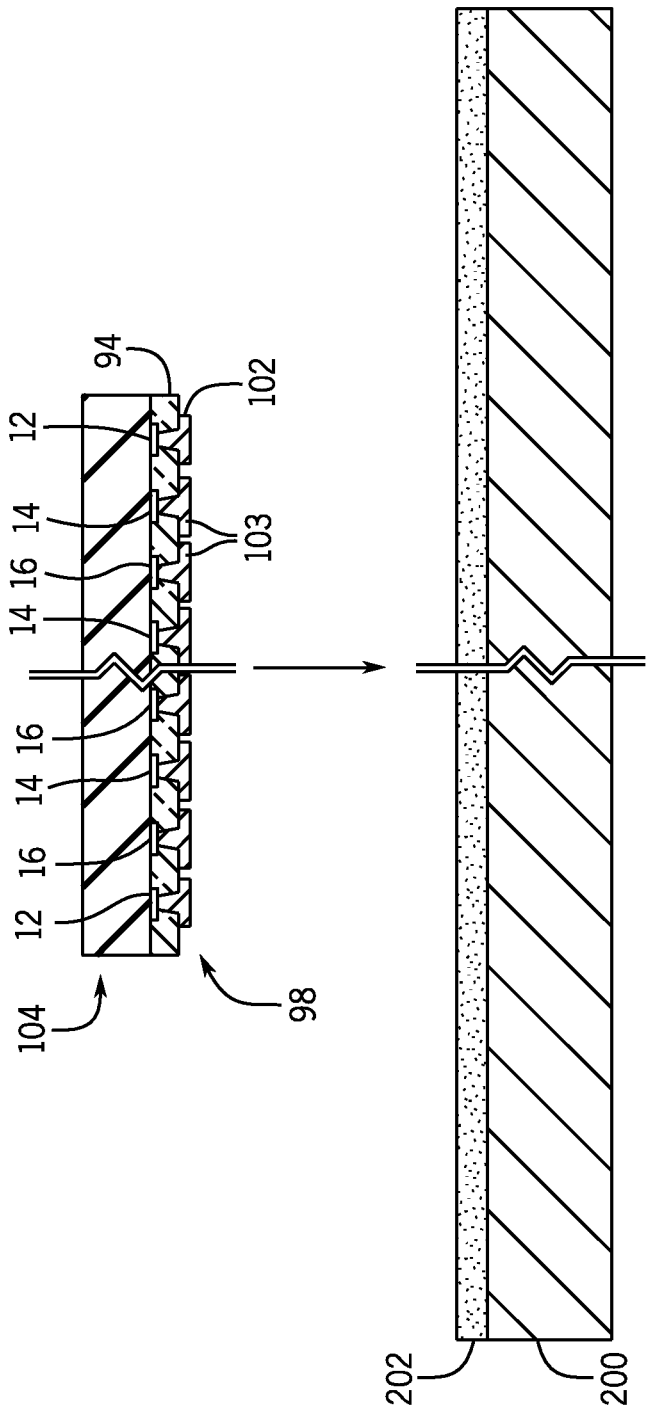

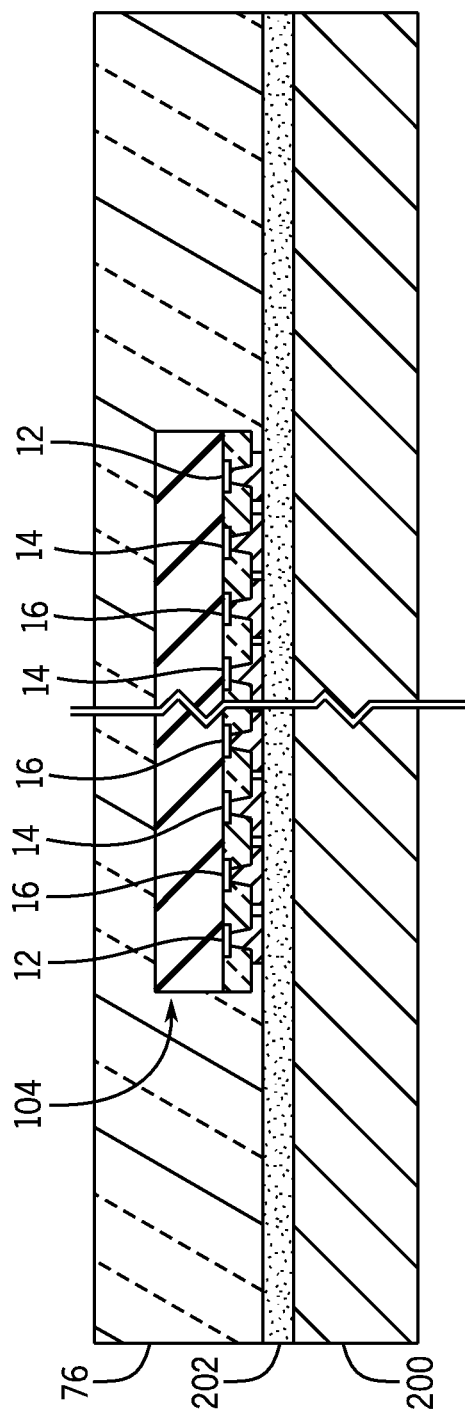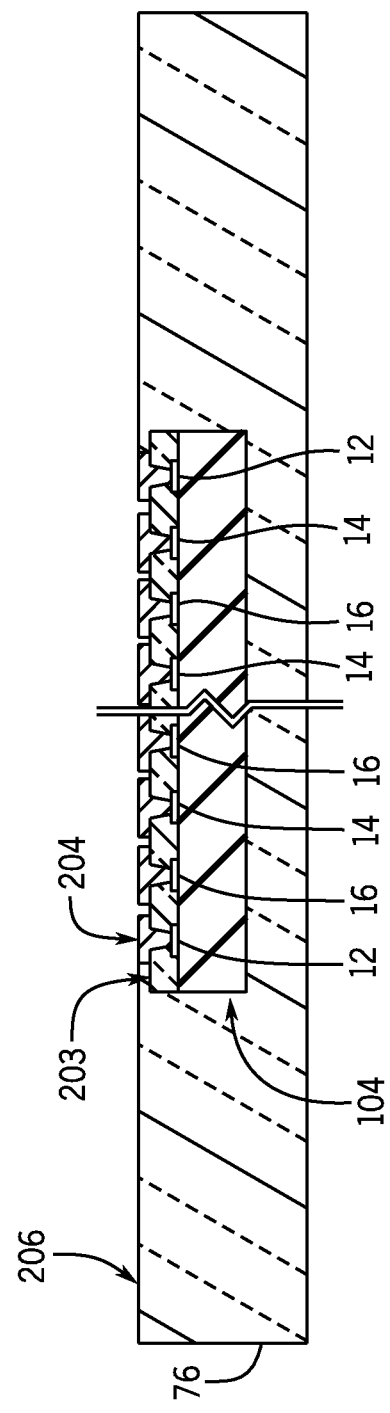

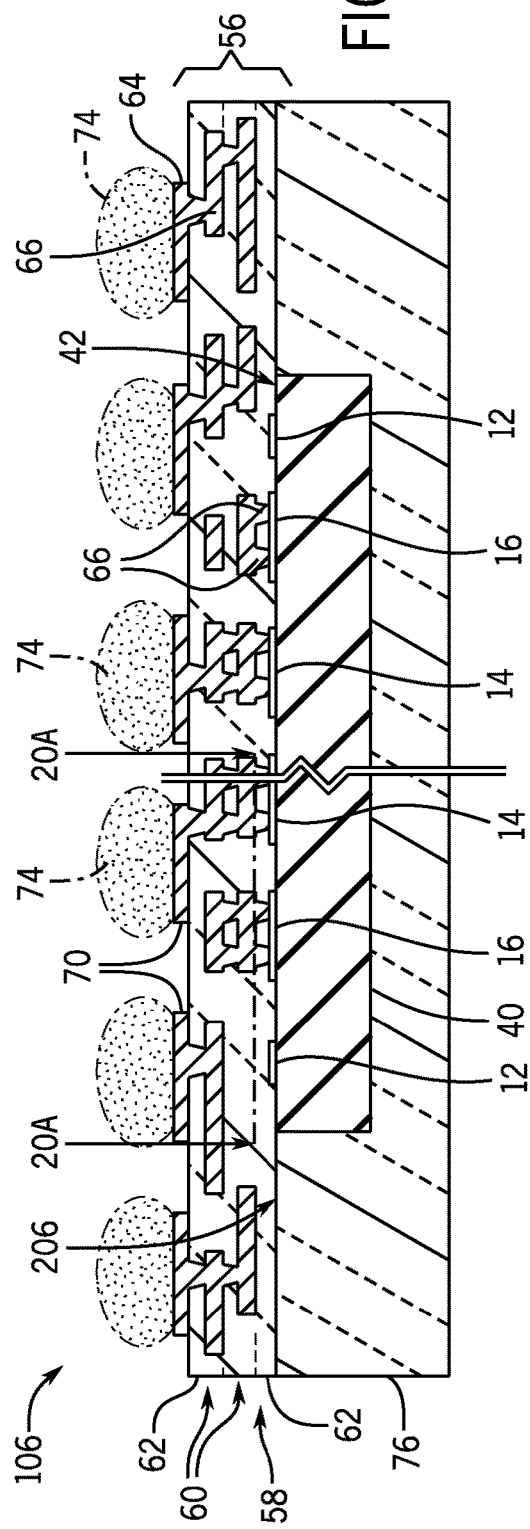
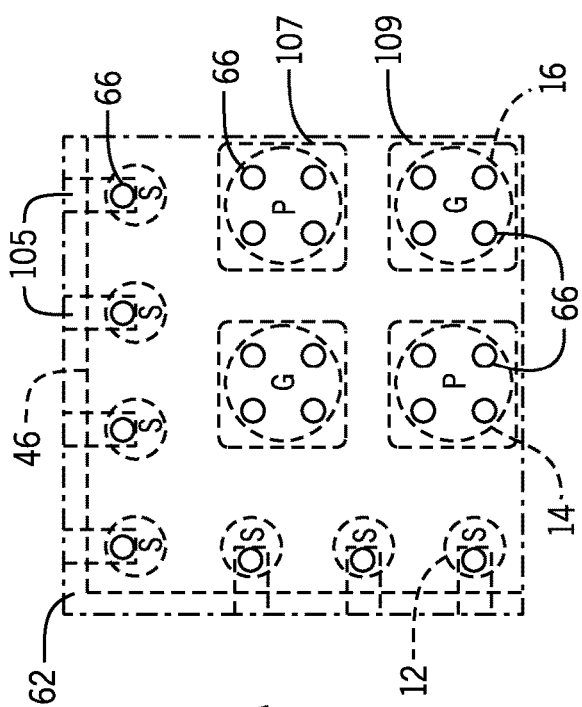
FIG. 20
FIG. 20A

SEMICONDUCTOR LOGIC DEVICE AND SYSTEM AND METHOD OF EMBEDDED PACKAGING OF SAME

BACKGROUND OF THE INVENTION

Embodiments of the invention relate generally to semiconductor logic devices and structures and methods for packaging semiconductor logic devices within embedded chip packages.

High performance, high pin count semiconductor logic devices or chips have hundreds or thousands of input/output ("I/O") pads for signals, power, and ground. FIG. 1 depicts an exemplary prior art semiconductor logic device 10 with signal I/O pads 12, power I/O pads 14, and ground I/O pads 16 arranged for flip chip solder bump attach. As shown, I/O pads 12, 14, 16 have the same pad size or diameter and are arranged in a uniform array on a grid of uniform x-axis pitch and y-axis pitch distributed over the whole surface of the device 10. A skilled artisan will recognize that a typical complex semiconductor logic device such as a microprocessor, applications processer, or graphics processor would have many more I/O pads than illustrated in FIG. 1. As such, semiconductor logic device 10 is depicted with break lines to represent portions of the semiconductor logic device 10 that have been omitted for clarity purposes.

Semiconductor logic devices such as device 10 are generally mounted to a board, substrate, or interconnect structure 18 by flip chip attach to form a flip chip package 20 as shown in FIG. 2. Solder bumps 22 are attached to each I/O pad 12, 14, 16 and reflowed to attach the device 10 to the upper pads 24 of the multi-layer interconnect structure 18. Interconnect structure 18 has multiple interconnect layers 26, each comprising an insulating layer 28, a wiring layer 30, and metallized vias 32 formed through the insulating layer 28. An underfill resin 34 lies between semiconductor logic device 10 and interconnect structure 18 and encapsulates the solder bumps 22 to control coefficient of thermal expansion (CTE) induced solder fatigue. The interconnect layers 26 electrically couple I/O pads 12, 14, 16 to the lower I/O terminals 36 of the multi-layer interconnect structure 18. Solder balls 38 are attached to the lower I/O terminals 36 and are used to interconnect the interconnect structure 18 to an external structure (not shown) such as a mother board.

Typically, high-end semiconductor logic chips have 70 to 85 percent of all I/O pads dedicated to power and ground due to high power/ground current levels in these devices and performance limitations of the solder bumps. Solder bumps have high resistance losses due to their low electrically conductivity and current limitations due to electro-migration susceptibility. This need for high numbers of power and ground I/O pads can force chip designers to increase the size of a high-end chip to a size larger than the design's gate count requires. Larger chips result in fewer chips per wafer and lower wafer level chip yields, which increases the cost of the chip.

For the past five decades, semiconductor processing has evolved to ever smaller minimum feature sizes—from tens of microns fifty years ago to ten to fifteen nanometers today. Smaller feature sizes allow semiconductor designers to design chips with small elements and permit more semiconductor elements, transistors, or gates per unit area, therefore providing more functionally per chip. This semiconductor evolution trend has generally been done in discrete steps defined by the minimum allowable feature size and are called semiconductor wafer fab nodes or semiconductor technology nodes. The 14-nanometer node is now in wide spread production with some high-end devices moving into the 10-nanometer node. These node shrinks are driven by the desire to add more gates or functionality per chip without increasing the physical size of the chip. Moving semiconductor logic device 10 from one semiconductor technology node onto another node with smaller minimum features allows the device to be shrunk to a smaller size, resulting in more devices per wafer and lower device fabrication costs. Redesigning a complex semiconductor logic device designed for fabrication on a 14-nanometer node line for fabrication on a 10-nanometer node line, for example, potentially provides a nearly 50% die size shrink. A move to an even smaller feature size semiconductor node could shrink the device even further.

Despite the ever-evolving push for device miniaturization, many flip chip devices with high I/O pad counts cannot reduce the die size when moving to a smaller feature node because of the minimum pitch allowable on solder bumped flip chip devices. The minimum pad pitch that can be flip chip solder bump attached with a sufficiently high assemble yield is referred to hereafter as the "minimum solderable pitch" and ranges from about 120 microns to about 160 microns depending on a particular assembly houses' individual assembly processes, materials, and capabilities. Flip chip devices with a full array of I/O pads on the minimum solderable pitch have a size that is pad count limited. Thus, reducing the size of semiconductor logic device 10 would require either reduction in the number of power and ground I/O pads, which would lower power and ground conductivity and device performance, or a reduction in the array grid pitch.

Reducing the array grid pitch is particularly problematic in flip chip solder ball attach. In the simplified pad configuration depicted in FIG. 1 for example, the I/O pads 12, 14, 16 are on the minimum solderable pitch. Example A of device 10 is a 900 I/O pad device with a full 30 by 30 array of I/O pads on a 150 micron pitch grid, with a die size of 4.5 mm×4.5 mm. In this example, there are 116 perimeter I/O signal pads all located on the outer row of the 30 by 30 array of pads. Device 10 also has 392 I/O power pads and 392 I/O ground pads all located in the inner rows of the array. A device with an array grid pitch of 150 microns would typically have 60-70 micron diameter I/O pads and an 80-90 micron solder bump diameter. A tighter grid pitch would require smaller I/O pads, smaller solder bumps, and would have lower bump conductivity, higher assembly costs, higher risk of bump-to-bump shorting, and lower solder fatigue compliance. As a result, designers may move a flip chip device that is pad count limited to a smaller semiconductor node to get improved device performance but the die size could not be shrunk without lower assembly yield, lower device reliability and increased costs.

One known technique for reducing pitch below the minimum solderable pitch is to replace the flip chip solder bumps 22 (FIG. 2) with copper pillars formed on the I/O pads 12, 14, 16 of semiconductor logic device 10. A thin layer of solder layer would be applied at the end of the copper pillars, often as a paste, and reflowed to couple the semiconductor logic device 10 to the interconnect structure 18. While copper pillars can be used on a tighter pitch than the minimum solderable pitch without causing a pad-to-pad short, shrinking the pitch of a copper pillar/solder layer flip chip attach structure increases the risk of electro-migration failures.

Another approach to addressing the performance limitations of flip chip and copper pillar interconnections is to embed logic devices into an organic substrate and form a build-up structure over the chip. U.S. Pat. No. 8,163,596 discloses an embedded chip module that bonds a semiconductor chip under an organic interconnect structure and encapsulates the chip in an organic molding material. The interconnect structure fans out the I/O pads of the chip to the perimeter region outside of the chip forming a fan-out wafer level device. U.S. Pat. No. 5,946,546 applies an organic interconnect structure of the surface of a semiconductor chip and fans in the chip I/O pads from the perimeter of the chip to an array of pads above the surface of the chip in order to convert a chip designed for wire bond assembly into a device with an area array of I/O terminals configured for flip chip solder bump assembly. The resulting reconfigured device could be flip chip attached onto a board, substrate or package, eliminating wire bonds.

One key problem with utilizing embedded chip packaging is that the interconnect structure built over the chip has a yield loss due to interconnect fabrication defects such as shorts and opens. A defect in the interconnect structure that is formed after a chip is embedded in the structure would cause the chip to be scrapped along with the defective interconnect structure. Yield losses are low (1-2%) in embedded chip packages that incorporate non-complex, low I/O count chips. Complex semiconductor logic devices with high numbers of I/O pads, on the other hand, require complex interconnect structures with unacceptable yield losses of 20% or higher. A 20% embedded chip yield loss would cause 20% of the complex chips to be scrapped with the defective interconnect structures in which they are embedded. For these reasons, the implementation of embedded chip technologies to complex semiconductor logic devices has been restricted and has not been done in high volume manufacturing.

Accordingly, there is a need for a miniaturized semiconductor logic device that addresses the above limitations and can be packaged using embedded chip technologies with low interconnect yields.

BRIEF DESCRIPTION OF THE INVENTION

In accordance with one aspect of the invention, a reconfigured semiconductor logic device includes a semiconductor logic device comprising an active surface having a plurality of input/output (I/O) pads formed thereon and a redistribution layer. The redistribution layer includes an insulating layer disposed on the active surface of the semiconductor logic device and a patterned conductive layer comprising a plurality of discrete terminal pads formed atop the insulating layer. The plurality of discrete terminal pads are electrically coupled to respective I/O pads of the plurality of I/O pads by conductive vias formed through the insulating layer. The plurality of discrete terminal pads are larger than the plurality of I/O pads.

In accordance with another aspect of the invention, a method of manufacturing a reconfigured semiconductor logic device includes forming an insulating layer on an active surface of a semiconductor logic device and forming a plurality of vias through the insulating layer to expose a plurality of input/output (I/O) pads on the active surface. The method also includes disposing a conductive material on a top surface of the insulating layer and into the plurality of vias and patterning the conductive material to form a plurality of electrically isolated terminal pads electrically coupled to respective I/O pads of the plurality of I/O pads through the plurality of vias. The plurality of electrically isolated terminal pads are larger than the respective I/O pads.

In accordance with another aspect of the invention, an electronics package includes a reconfigured semiconductor device comprising a semiconductor device and a reconfiguration layer. The reconfiguration layer includes an insulating layer covering an active surface of the semiconductor device having a plurality of input/output (I/O) pads located thereon. The reconfiguration layer also includes a plurality of discrete terminal pads electrically coupled to the plurality of I/O pads through the insulating layer, the plurality of discrete terminal pads being larger than the plurality of I/O pads. The electronics package also includes a multi-layer interconnect structure having a first interconnect insulating layer formed atop the reconfiguration layer and a first conductive wiring layer plated on a top surface of the first interconnect insulating layer. The first conductive wiring layer extends through a plurality of sets of parallel vias formed through the first interconnect insulating layer to contact the plurality of discrete terminal pads. Each set of parallel vias is aligned above a respective terminal pad of the plurality of discrete terminal pads.

In accordance with yet another aspect of the invention, a method of manufacturing an electronics package includes coupling a top surface of a reconfigured semiconductor device to a first surface of a base insulating layer, the reconfigured semiconductor device comprising a redistribution insulating layer formed over an active surface of a semiconductor device and a plurality of discrete terminal pads formed on the redistribution insulating layer and extending therethrough to couple with a plurality of input/output (I/O) pads located on the active surface, the plurality of discrete terminal pads larger than the plurality of I/O pads. The method also includes forming a plurality of sets of parallel vias through the base insulating layer, each set of parallel vias formed to a respective terminal pad of the plurality of discrete terminal pads. The method further includes forming a conductive wiring layer atop the base insulating layer, the conductive wiring layer electrically coupled to respective terminal pads of the plurality of discrete terminal pads through a set of parallel vias of the plurality of sets of parallel vias.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIGS. 11-15 are schematic cross-sectional side views of an electronics package during various stages of a manufacturing/build-up process, according to an embodiment of the invention.

FIG. 13A is a sectional view of a portion of the electronics package during the stage of the manufacturing/build-up process illustrated in FIG. 13.

FIG. 14A is a sectional view of a portion of the electronics package during the stage of the manufacturing/build-up process illustrated in FIG. 14.

FIG. 15A is a sectional view of a portion of the electronics package during the stage of the manufacturing/build-up process illustrated in FIG. 15.

FIGS. 17-19 are schematic cross-sectional side views illustrating various stages of a process for embedding a reconfigured semiconductor logic device, according to an embodiment of the invention.

FIG. 20 is a schematic cross-sectional view of an electronic package including a semiconductor logic device, according to another embodiment of the invention.

FIG. 20A is a sectional view of a portion of the electronics package of FIG. 20 during one stage of a manufacturing/build-up process thereof.

DETAILED DESCRIPTION

Figure 3:
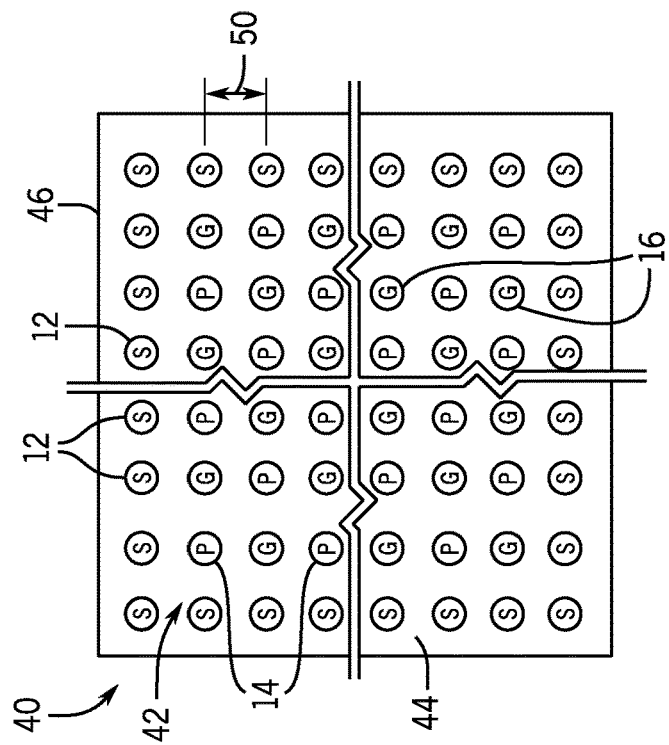
FIG. 3 is a schematic top view of a semiconductor logic device, according to an embodiment of the invention.

Embodiments of the present invention provide for semiconductor logic devices and embedded electronics packages that include a configuration of parallel electrical connections that enables improved electrical performance, improved packaging yields, and reduced chip costs. In some embodiments, these parallel electrical connections are formed using terminal pads that are included within an improved interconnect structure formed on the active surface of the semiconductor logic device. In other embodiments, the semiconductor logic device itself is designed with larger I/O pads to enable formation of parallel electrical connections thereto. The I/O pad configuration and device-level interconnect structure provides the capability to shrink the overall size of the semiconductor logic device while maintaining or improving power and ground signal delivery. In various embodiments, the semiconductor logic device is designed with I/O pads that have a pitch less than a minimum solderable pitch, I/O pads of differing sizes and/or differing pitch, and/or a reduced number of power and ground I/O pads thereby making the semiconductor logic device incompatible with flip chip attachment techniques.

As used herein, the term "semiconductor logic device" refers to a semiconductor component, integrated circuit, device, die or chip that processes digital data in order to control the operation of electronic systems. Semiconductor logic devices are constructed from small electronic circuits called logic gates that can be used to create combinational logic. Semiconductor logic devices are formed using semiconductor elements and perform specific functions such as a microprocessor, memory device, imaging or video processing circuit, controller, digital signal processor (DSP), Application Specific Integrated Circuit (ASIC), or microcontroller, as non-limiting examples. High performance semiconductor logic devices are high pin count devices, meaning that they have hundreds or thousands of input/output (I/O) interconnections for signals, power, and ground. These I/O interconnections are referred to herein as I/O pads, are used to connect the semiconductor logic device to external circuitry, and are electrically coupled to internal elements within the semiconductor logic device.

While the various embodiments of electronics packages referenced below are shown and described as including a particular arrangement of a semiconductor logic device, interconnection wiring, and electronic package terminals, it is understood that alternative arrangements and configurations could also be implemented and thus embodiments of the invention are not limited only to the specifically illustrated devices and arrangements thereof. That is, the electronics package embodiments described below should also be understood to encompass electronic packages that might include additional electronic components and/or one or more alternative device types of semiconductor logic devices than those listed above. The electronics packages described herein may also include one or more resistors, capacitors, inductors, filters and similar devices and combinations thereof. As used herein the term "electrical component" may be understood to encompass any of the various types of semiconductor logic devices described above as well as resistors, capacitors, inductors, filters and similar passive devices, and other types of semiconductor devices.

Referring now to FIG. 3, a semiconductor device 40 is disclosed according to an embodiment of the invention. Semiconductor device 40 is depicted with break lines representing portions of the area array omitted for clarity purposes. Similar to semiconductor logic device 10 of FIG. 1, semiconductor device 40 includes an area array of signal, power, and ground I/O pads 12, 14, 16 formed on the topside or active surface 42 of the semiconductor base substrate 44 of the semiconductor device 40. I/O pads 12, 14, 16 may have a composition that includes a variety of electrically conductive materials such as aluminum, copper, gold, silver, nickel, or combinations thereof as non-limiting examples.

I/O pads 12, 14, 16 provide conductive routes (I/O connections) to internal contacts such as transistors or logic gates formed within an internal contact region 43 (FIG. 6) of the semiconductor base substrate 44 proximate the active surface 42 of the semiconductor logic device 40. According to various embodiments, semiconductor logic device 40 may be a semiconductor logic device that includes hundreds of thousands, if not millions of internal contacts. These internal contacts are omitted from FIG. 6 for purposes of clarity and in light of the scale mismatch relative to the illustrated components. It is contemplated that the internal contacts of semiconductor logic device 40 may be constructed according to known techniques.

Figure 1:
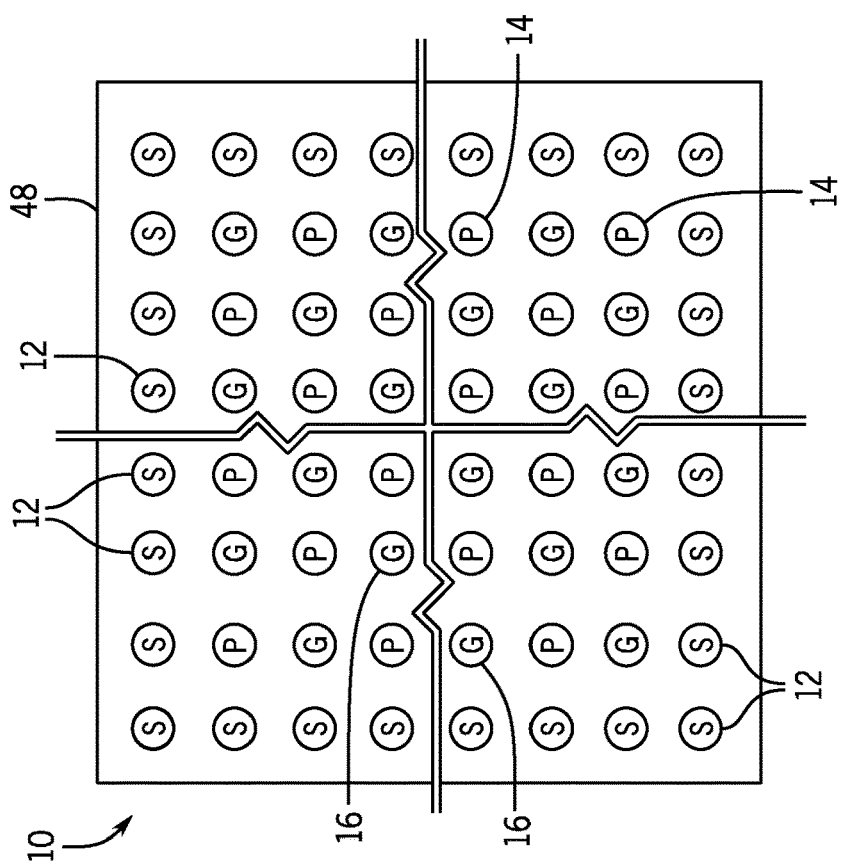
FIG. 1 is a schematic cross-sectional view of an exemplary, prior art semiconductor logic device.
Figure 2:
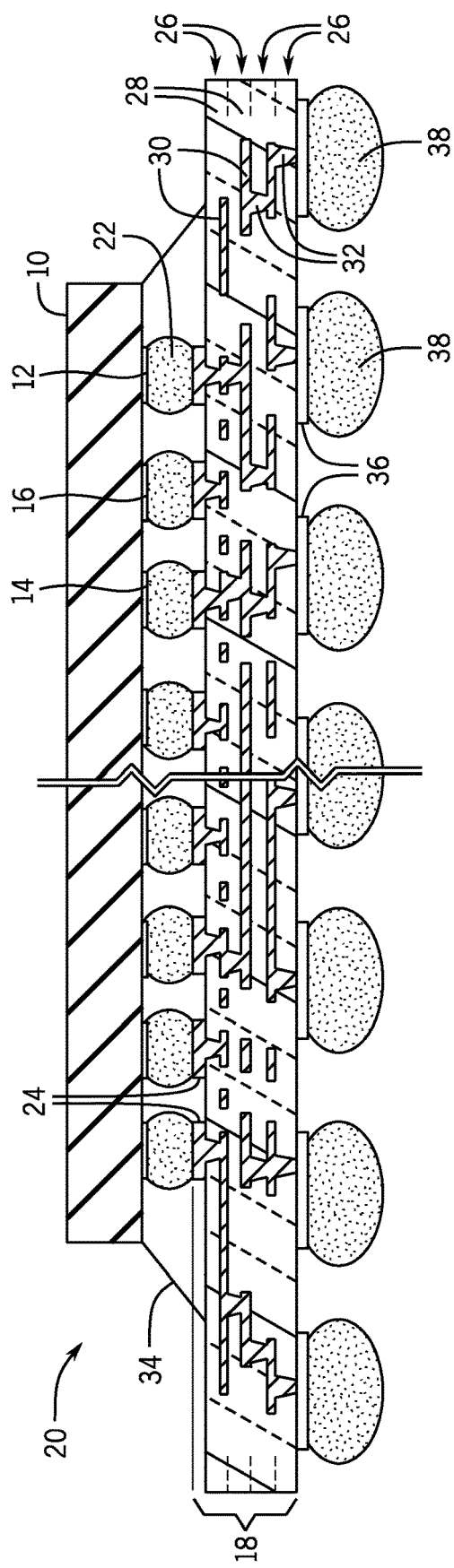
FIG. 2 is a schematic cross-sectional view of an exemplary prior art flip chip electronic package.

Semiconductor logic device 40 retains the same internal device functions as the semiconductor logic device 10 of FIG. 1 but with a feature size reduction that results in an overall die shrink (i.e., a smaller outer perimeter 46) as compared to perimeter 48 of semiconductor logic device 10. In the embodiment illustrated in FIG. 3, this feature size reduction is accomplished by reducing the pad pitch of the signal, power, and ground I/O pads 12, 14, 16 while maintaining the same number of signal, power, and ground I/O pads 12, 14, 16 as the larger semiconductor logic device 10. As shown in FIG. 3, I/O pads 12, 14, 16 are arranged in an area array of I/O pads that is formed as a grid with uniform x-axis and y-axis pitch distributed over the whole active surface 42 of the device 40. As used herein, the term "pitch" refers to the center-to-center distance between adjacent I/O pads. In some embodiments, the size (i.e., surface area) of the I/O pads 12, 14, 16 is also reduced as compared to semiconductor logic device 10. In such case, the overall die shrink of semiconductor logic device 40 is accomplished by reducing all of the device features of the original semiconductor logic device 10 by the same percent reduction, thereby avoiding the need to re-layout I/O gate to I/O pad routing and other internal features of the semiconductor logic device 10 located within internal contact region 43.

An exemplary embodiment of semiconductor logic device 40 of FIG. 3 is described herein as Example A' to highlight distinctions between the previously described prior art construction of device 10 and embodiments of the present invention. However, the overall array arrangement and number of signal, power, and ground I/O pads 12, 14, 16 of device 40 may be varied based on particular design specifications in alternative embodiments. In Example A', semiconductor logic device 40 is a die shrunk version of the Example A configuration of device 10. The die size has been shrunk from 4.5 mm by 4.5 mm to 3.95 mm by 3.95 mm, about a 23% die shrink based upon a feature size reduction of about 12.5%. Device 40 has the same number of signal, power, and ground I/O pads as device 10 of Example A—116, 392, and 392 respectively—which are arranged on a reduced pad pitch of 130 microns.

Figure 4:
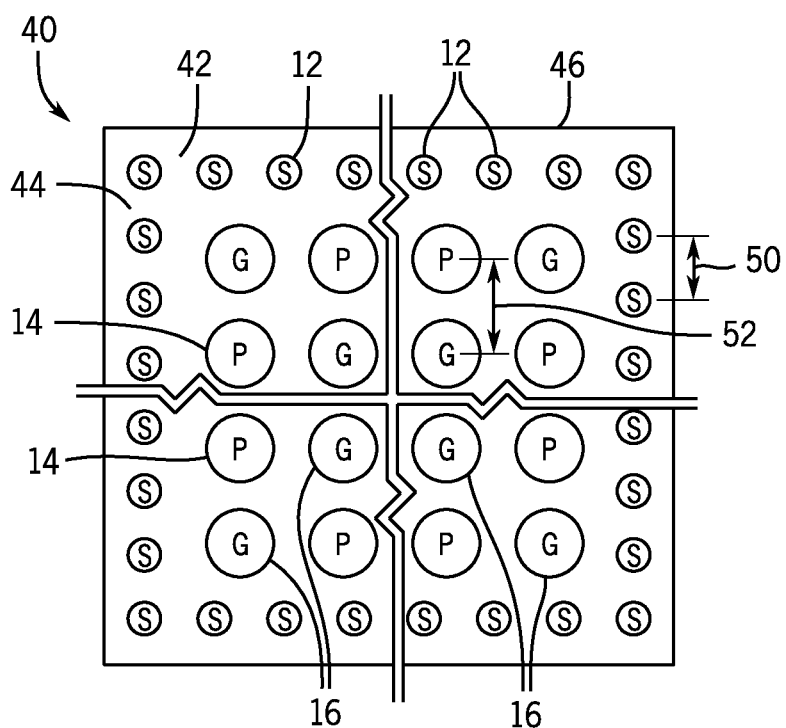
FIG. 4 is a schematic top view of a semiconductor logic device, according to another embodiment of the invention.

In alternative embodiments the feature size reduction may be accomplished by reducing the number of power and ground I/O pads 14, 16 and, optionally, also by reducing the pad pitch of the signal I/O pads 12. An exemplary semiconductor logic device 40 with I/O pads 12, 14, 16 configured in this manner is illustrated in FIG. 4. As shown, signal I/O pads 12 of semiconductor logic device 40 are located in an exterior region adjacent perimeter 46 of the device 40 and arranged in the outer rows of the array that surround the area array of power and ground I/O pads 14, 16 that are located in the central region of device 40. Semiconductor logic device 40 includes a reduced number of power I/O pads 14 and ground I/O pads 16 located in an interior region of the semiconductor logic device 40. Power and ground I/O pads 14, 16 have a larger surface area and a larger pitch 52 as compared to device 10 (FIG. 1). In some embodiments, the individual signal I/O pads 12 of semiconductor logic device 40 have a smaller surface area (e.g., have a smaller diameter) than power and ground I/O pads 14, 16.

An exemplary embodiment of semiconductor logic device 40 of FIG. 4 is described herein as Example A" to highlight distinctions between the previously described prior art construction of device 10 and embodiments of the present invention. In Example A", semiconductor logic device 40 is a die shrunk version of the device 10 from Example A according to one embodiment of this invention. The die size has been shrunk from 4.5 mm by 4.5 mm to 3.9 mm by 3.9 mm, about a 25% die shrink based upon a feature size reduction of about 13%. It has the same number of signal I/O pads (116) as device 10 of Example A on a reduced pad pitch of 130 microns. It has an array of 20 by 20 I/O power and I/O ground pads formed in the center of the device on a larger pitch, 180 microns. Whereas non-shrunk device 10 of Example A had 392 I/O power pads and 392 I/O ground pads, shrunk device 40 of Example A" has 200 I/O power pads and 200 I/O ground pads.

In the embodiment illustrated in FIG. 4, signal I/O pads 12 are arranged on a smaller pitch 50 than the minimum solderable pitch of device 10. In the embodiment illustrated in FIG. 3 all of the I/O pads 12, 14, 16 of semiconductor logic device 40 are arranged on a smaller or tighter pitch 50 than the minimum solderable pitch of device 10. In other words, I/O pads 12, 14, 16 are formed at a non-solderable pitch or a pitch less than a minimum pitch for solder bump attachment. In one exemplary and non-limiting embodiment pitch 50 is 130 microns. In other embodiments, pitch 50 may be in the range of 80 to 100 microns. Therefore, the semiconductor logic devices 40 illustrated in FIGS. 3 and 4 are not compatible with flip chip solder assembly.

Figure 5:
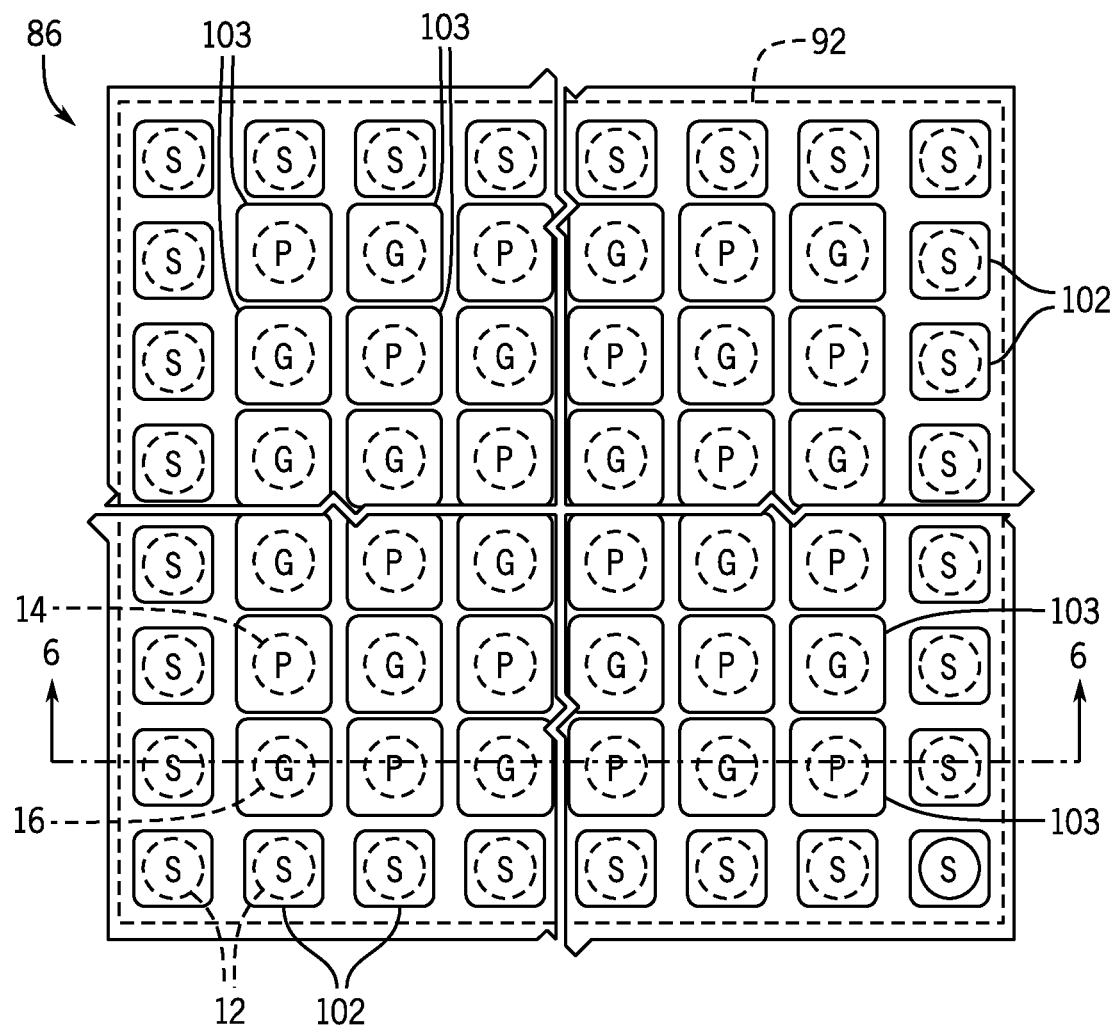
FIG. 5 is a schematic top view of a portion of a wafer-level reconfigured semiconductor logic structure including a redistribution layer, according to an embodiment of the invention.

In order to optimize semiconductor logic device 40 for insertion into an embedded chip package, a reconfiguration or redistribution layer is formed over the semiconductor logic device 40 at the wafer level (i.e., before singulation). FIG. 5 depicts a portion of a wafer-level reconfigured semiconductor logic structure 86, according to an embodiment of the invention. Reconfigured semiconductor logic structure 86 is formed by applying at least one on-wafer redistribution layer 88 on a completed semiconductor wafer 90 that includes a number of die sites 92. In the illustrated embodiment, I/O pads 12, 14, 16 are arranged in a similar manner as the semiconductor logic device 40 of FIG. 3. However, it is to be understood that on-wafer redistribution layer 88 may be utilized in a similar manner with a semiconductor wafer fabricated with die sites that include an area array of I/O pads 12, 14, 16 similar to that depicted in FIG. 4 or in any alternative arrangement with the size, pitch, and number of I/O pads 12, 14, 16 determined based on particular design specifications. While described as being formed at the wafer level, it is contemplated that the techniques described herein for fabricating redistribution layer 88 can be extended to forming one or more redistribution layers at the die level on singulated semiconductor logic devices or other types of electrical components.

Figure 6:
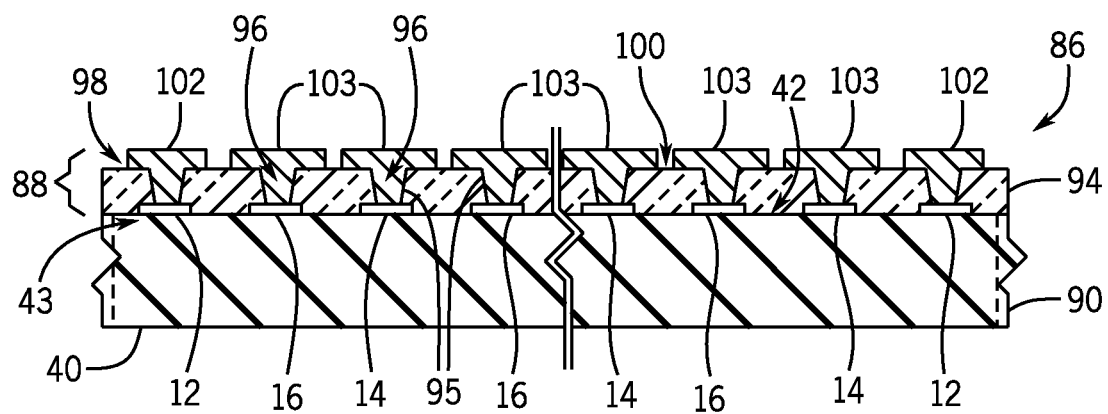
FIG. 6 is a schematic cross-sectional view of a portion of the wafer-level reconfigured semiconductor logic structure of FIG. 5, according to an embodiment of the invention.

As shown in the cross-sectional view provided in FIG. 6, on-wafer redistribution layer 88 is formed on the active surface 42 of wafer 90. In the illustrated embodiment, on-wafer redistribution layer 88 includes an insulating layer 94, a patterned conductive layer 98, and conductive vias 95 formed through the insulating layer 94. In other embodiments additional redistribution layers may be formed between redistribution layer 88 and semiconductor logic device 40 to achieve a desired routing pattern to I/O pads 12, 14, 16.

Insulating layer 94 is preferably an organic resin such as, for example, a polyimide, Ultem®, bismaleimide-triazine (BT) resin, liquid crystal polymer, benzocyclobutane (BCB), polyetherimide, epoxy, epoxy-glass or the like. However, it is contemplated that insulating layer 94 may be provided in the form of another suitable electrically insulating material, insulating film or dielectric substrate, such as for example a Kapton® laminate flex, polytetrafluoroethylene (PTFE), or another polymer film, such as a liquid crystal polymer (LCP), or inorganic films such as ceramic or glass, as non-limiting examples. Alternatively, insulating layer 94 may be provided as an organic film provided with an adhesive layer, a self-bonding film, such as, for example, an epoxy-fiber glass pre-preg, or a liquid dispensed dielectric that is cured in place.

Patterned conductive layer 98 is formed on the outer surface 100 of the insulating layer 94 and extends into vias 96 and onto exposed portions of I/O pads 12, 14, 16, forming electrical connections between conductive layer 98 and I/O pads 12, 14, 16. The patterned conductive layer 98 includes terminal connections that each include a conductive pad, referred to herein as the signal terminal pads 102 and power and ground terminal pads 103, and a conductive via 95 that extends through the redistribution insulating layer 94 to couple a respective conductive pad 102, 103 to a respective I/O pad 12, 14, 16. Terminal pads 102 and 103 are formed as discrete elements that are electrically isolated from one another across the outer surface of insulating layer 94. While terminal pads 102 and 103 are illustrated in FIG. 5 with a substantially square geometry, it is contemplated that terminal pads 102, 103 may be formed as circular elements or with any alternative geometrical configuration. Terminal pads 102 are electrically coupled to signal I/O pads 12 and terminal pads 103 are electrically coupled to power and ground I/O pads 14, 16. In some embodiments, conductive layer 98 may be patterned to include routing traces (not shown) that are electrically coupled to one or more of terminal pads 102, 103. The patterning can be done for example by standard additive, semi-additive, or subtractive patterning processes.

Terminal pads 102, 103 are larger (e.g., have a larger surface area or diameter) than their underlying I/O pads 12, 14, 16. In some embodiments the power and ground terminal pads 103 are formed larger (e.g., with a larger surface area) than the signal terminal pads 102. In one embodiment, terminal pads 102, 103 are at least twice as large as their respective I/O pads 12, 14, 16. In the embodiment illustrated in FIG. 5, terminal pads 102, 103 are formed directly over I/O pads 12, 14, 16. Alternatively, it is contemplated that any of terminal pads 102, 103 may be offset from the center points of their respective I/O pads 12, 14, 16. As described in more detail below, the increased size of power and ground terminal pads 103 relative to the size of the underlying power or ground I/O pads 14, 16 facilitates forming multiple conductive via connections per terminal pad 103 or larger via connections during the embedded chip process to minimize contact resistance and improve interconnect yield.

Figure 7:
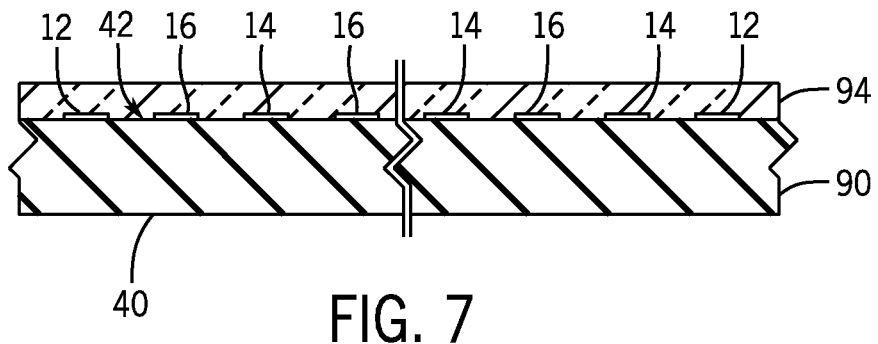
FIGS. 7-9 are schematic cross-sectional views of a portion of a wafer-level reconfigured semiconductor logic structure during various stages of a manufacturing process, according to an embodiment of the invention.
Figure 8:
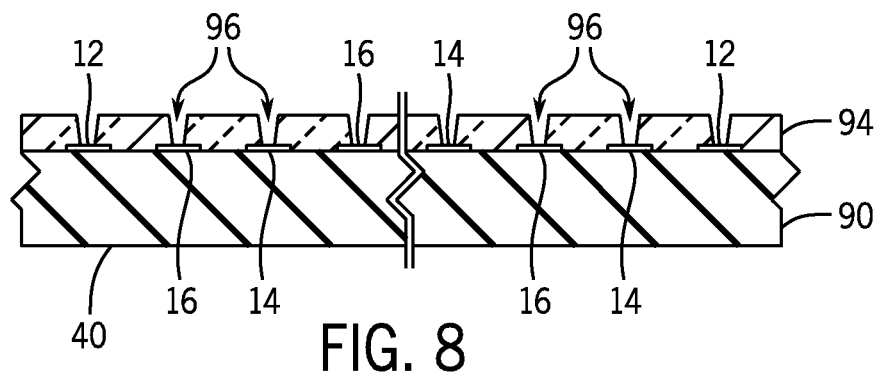
Figure 9:
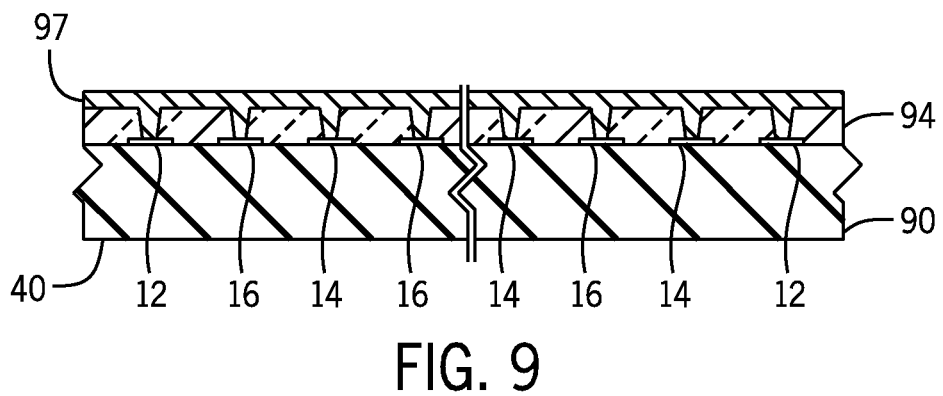

Select steps of a technique for manufacturing the on-wafer redistribution layer 88 are illustrated in FIGS. 7-9, according to one embodiment of the invention, with each figure illustrating a cross-section of the on-wafer redistribution layer 88 and underlying wafer 90 during the build-up process. Referring first to FIG. 7, fabrication of on-wafer redistribution layer 88 begins by dispensing insulating layer 94 on the active surface 42 of the wafer 90. Insulating layer 94 may be applied by any known technique such as, for example, spin coating, spray coating, evaporation, or meniscus coating.

After insulating layer 94 is cured, vias 96 are formed through insulating layer 94 to the I/O pads 12, 14, 16 of semiconductor logic device 40, as shown in FIG. 8. Vias 96 may be fabricated using known techniques such as, for example, laser ablation, plasma etch, chemical etch, or a combination of such. In some embodiments, vias 96 may be formed with a diameter of 10-50 microns. However, the dimensions of vias 96 may fall outside of this range in alternative embodiments. Optionally, the vias 96 formed to the larger power and ground I/O pads 14, 16 may have a larger diameter than those formed to the smaller signal pads 12 to enable higher current capability and lower interconnect resistance for the electrical connections formed to power and ground I/O pads 14, 16. In one embodiment, vias 96 are formed having angled side surfaces, as shown in FIG. 8, to facilitate later filling and metal deposition. Alternatively, vias 96 may be straight-sided. Vias 96 are subsequently cleaned such as through a reactive ion etching (RIE) desoot process or laser process.

The manufacturing technique continues by plating a layer of conductive material 97 or metallization layer directly on insulating layer 94 as shown in FIG. 9. According to alternative embodiments, the layer of conductive material 97 contains a bulk metal such as copper, aluminum, or other standard wiring metal and may contain a barrier or adhesion metal such as titanium or chromium and is deposited by one or more of sputtering, evaporation, electroless plating, electroplating, or other standard metal deposition processes. Alternatively, the layer of conductive material 97 is formed from an electrically conductive polymer or inks that contain conductive metal particles. The layer of conductive material 97 extends through vias 96 to electrically couple with I/O pads 12, 14, 16.

Portions of conductive layer 97 are then selectively removed using known patterning techniques to form the patterned conductive wiring layer 98 shown in FIGS. 5 and 6. In other embodiments, the patterned conductive layer 98 may be formed using any known patterning techniques such as, for example, fully subtractive patterning, semi-additive pattern plate-up, or additive plate-up. In yet other embodiments, patterned conductive layer 98 is a printed conductive material formed using a deposition technique such as inkjet printing, screen printing, or dispensing, as non-limiting examples.

While the wafer-level reconfigured semiconductor logic structure 86 is disclosed herein as including a single on-wafer redistribution layer 88, it is contemplated that one or more additional redistribution layers may be formed atop redistribution layer 88 in alternative embodiments to achieve a desired reconfigured pattern of I/O connections to signal, power, and ground I/O pads 12, 14, 16, with the topmost layer including a configuration of discrete terminal pads 102, 103 that are electrically connected to underlying I/O pads 12, 14, 16 by way the conductive layer(s) of one or more intermediate redistribution layers. Once the redistribution layer(s) 88 is/are complete the wafer-level reconfigured semiconductor logic structure 86 may be singulated into individual reconfigured semiconductor logic devices. In a singulated reconfigured semiconductor logic device, the overall footprint of the reconfiguration layer(s) 88 is equal to that of the underlying semiconductor logic device 40. As such, the insulating layer 94 and conductive layer 98 do not extend beyond the outer perimeter 46 of the underlying semiconductor logic device 40.

Figure 10:
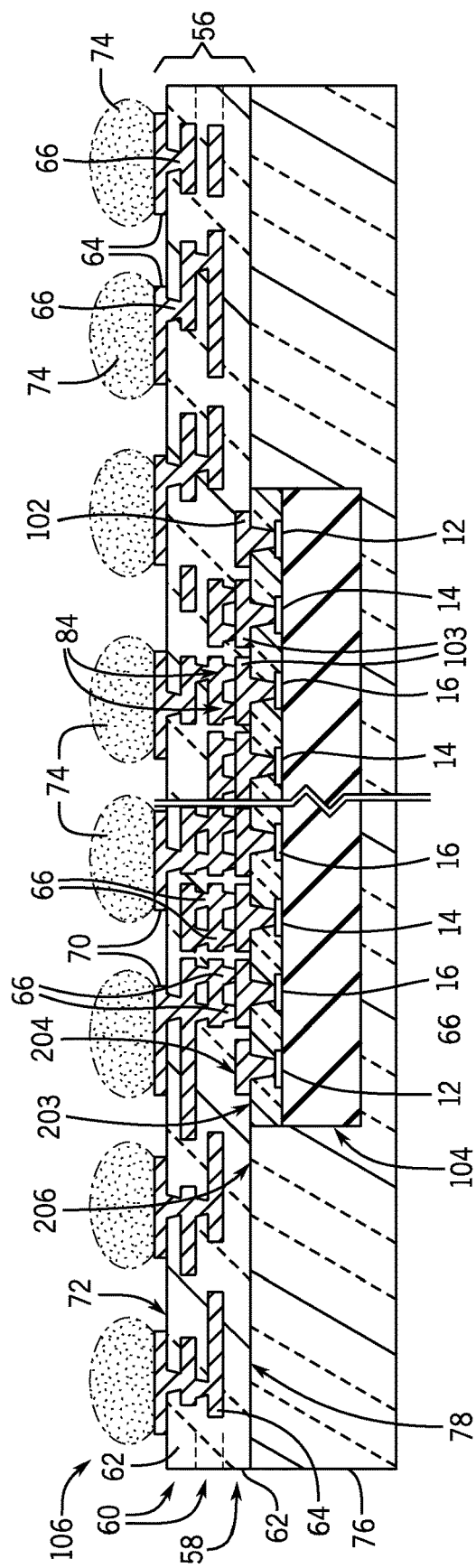
FIG. 10 is a schematic cross-sectional view of an electronic package including a reconfigured semiconductor logic device, according to an embodiment of the invention.

After singulating the wafer-level reconfigured semiconductor structure 86 of FIG. 5 into discrete devices, one or more of the singulated reconfigured semiconductor devices 104 may incorporated within an electronics package. FIG. 10 depicts one embodiment of an electronics package 106 that includes a reconfigured semiconductor device 104 manufactured with the patterned conductive layer 98 of FIG. 5.

Instead of the solder bumps and copper pillar/solder paste connections of the prior art constructions, embedded chip package 106 includes conductive interconnections to the I/O pads 12, 14, 16 of semiconductor logic device 40 that are formed without any solder. These interconnections are made by way of a multi-layer interconnect structure or overlay interconnect structure 56 that is formed over the top surfaces 203, 204 of the insulating layer 94 and patterned conductive layer 98 and the top surface 206 of the insulating material 76. In the illustrated embodiment, overlay interconnect structure 56 includes a base interconnect layer 58 and two rerouting interconnect layers 60. In other embodiments additional rerouting interconnect layers may be included or either or both of the first or second rerouting interconnect layers 60 may be omitted entirely.

Base interconnect layer 58 is composed of an insulating layer 62, a patterned conductive wiring layer 64, and conductive vias 66 that extend through a series of vias 84 in the insulating layer 62 and span the thickness of the insulating layer 62 between conductive wiring layer 64 and the patterned conductive layer 98. Conductive wiring layer 64 is preferably a patterned metal layer such as aluminum, copper, gold, silver, nickel, or combinations thereof as non-limiting examples. However, other electrically conducting materials or a combination of metal and a filling agent may be used in other embodiments.

Multiple conductive vias 66 are formed to select power and/or ground terminal pads 103, thereby forming parallel electrical connection pathways between a respective I/O pad 14, 16 and the conductive wiring layer 64. The larger footprint of terminal pads 103 permits two or more of these parallel conductive vias 66 to be formed to each of the power or ground terminal pads 103 as desired. In an alternative embodiment, some of the conductive vias 66 connected to the power and ground terminal pads 103 are larger than (e.g., have a larger diameter) the conductive vias 66 formed to the terminal pads 102, thereby providing increased conductivity to the high current power and ground I/O pads 14, 16. In yet another embodiment, embedded chip package 106 may include a combination of parallel conductive vias 66 formed to some of the power and ground terminal pads 103 and larger conductive vias 66 formed to other of the power and ground terminal pads 103.

The top surfaces 203, 204 of reconfigured semiconductor logic device 104 are affixed to insulating layer 62 either through adhesive properties of the insulating layer 62 itself or by way of an intermediate bonding or attachment layer (not shown). According to various embodiments, insulating layer 62 may be provided in the form of an insulating film or dielectric substrate, such as for example a Kapton® laminate flex, although other suitable electrically insulating materials may also be employed, such as Ultem®, polytetrafluoroethylene (PTFE), or another polymer film, such as a liquid crystal polymer (LCP) or a polyimide substrate, or inorganic films such as ceramic or glass, as non-limiting examples. Alternatively, insulating layer 62 may be provided as an organic film provided with an adhesive layer, a self-bonding film, such as, for example, an epoxy-fiber glass pre-preg, or a liquid dispensed dielectric that is cured in place.

One or more additional rerouting interconnect layers 60 may be formed atop base interconnect layer 58 to add additional routing capability for more complex semiconductor logic devices. Any or all of these additional rerouting interconnect layers 60 may include multiple conductive vias 66 that form parallel electrical connections between electrical traces or routing paths of two adjacent conductive wiring layers 64. The conductive wiring layer 64 of the topmost interconnect layer 60 is patterned to form module I/O pads 70. Embedded chip package 106 may include optional solder bumps or solder balls 74 (shown in phantom) connected to the module I/O pads 70.

Reconfigured semiconductor logic device 104 is at least partially embedded within an insulating material 76 or molding material that surrounds the side surfaces (and optionally the backside) of reconfigured semiconductor logic device 104 and the exposed bottom surfaces 78 of insulating layer 62. As used herein the phrase "insulating material" refers to an electrically insulating material or molding material that adheres to surrounding components of the electronics package such as a polymeric material (e.g., epoxy, liquid crystal polymer, ceramic or silica filled polymers) or other organic material as non-limiting examples. In one exemplary embodiment, insulating material 76 is an epoxy with filler particles to control the coefficient of thermal expansion (CTE). While insulating material 76 is illustrated as encapsulating the sides and backside of reconfigured semiconductor logic device 104, insulating material 76 may be formed in a manner that leaves the backside of the device 104 exposed in alternative embodiments. In other embodiments, the insulating material 76 may be omitted entirely.

Referring now to FIGS. 11-15, select steps of a technique for manufacturing the embedded chip package 106 are set forth, according to one embodiment of the invention, with each figure illustrating a cross-section of the electronics package 106 during the build-up process. While FIGS. 11-15 illustrate the manufacture of a single electronics package, one skilled in the art will recognize that multiple electronics packages could be manufactured in a similar manner at the panel level and then singulated into individual electronics packages as desired.

Referring first to FIG. 11, fabrication of embedded chip package 106 begins by attaching the top surfaces 203, 204 of reconfigured semiconductor logic device 104 to the bottom surface 78 of insulating layer 62 using conventional pick and place equipment and methods. In some embodiments, such as, for example, embodiments where insulating layer 62 is provided in either an uncured or partial cured (i.e., B-stage) form and has adhesive properties, reconfigured semiconductor logic device 104 is attached directly to insulating layer 62. Alternatively, an organic adhesive (not shown) can be applied either on insulating layer 62 or on the top surfaces 203, 204 of reconfigured semiconductor logic device 104 prior to positioning device 104 on insulating layer 62.

The manufacturing process continues in FIG. 12 by dispensing an insulating material 76 over and around the reconfigured semiconductor logic device 104, thereby encapsulating the exposed portions of the bottom surface 78 of insulating layer 62, the side surfaces of reconfigured semiconductor logic device 104, and (optionally) the backside surface of device 104. One or both of top surfaces 203, 204 are coplanar or substantially coplanar with the top surface of insulating material 76. According to alternative and non-limiting embodiments, insulating material 76 may be applied using a spin coating, pour molding, transfer molding, injection molding, or compression molding process. Insulating layer 62 and insulating material 76 are fully cured, thermally or by way of a combination of heat or radiation. Suitable radiation may include UV light and/or microwaves. In one embodiment, a partial vacuum and/or above atmospheric pressure may be used to promote the removal of volatiles from the insulating layer 62 and insulating material 76.

Referring now to FIG. 13, a plurality of vias 84 are formed through insulating layer 62 to expose the terminal pads 102, 103. Vias 84 may be formed by a direct write UV laser by laser ablation. Alternately, vias 84 may be formed by way of other methods utilizing a mask including: plasma etching, wet etching, photo-definition or other laser techniques like CO2 and excimer. In some embodiments, vias 84 have a diameter within the range of 5 to 100 microns. However, vias 84 may be formed having dimensions outside this range in alternative embodiments. In one embodiment, vias 84 are formed having angled side surfaces to facilitate the subsequent metal deposition step. Alternatively, vias 84 may be straight-sided.

FIG. 13A is a sectional view of the intermediate package structure of FIG. 13 that includes a corner portion of reconfigured semiconductor logic device 104. As shown, multiple vias 84 are formed to the power and ground terminal pads 103. While FIG. 13A depicts four vias 84 formed to each terminal pad 103 and a single via 84 formed to each signal pad 102, multiple vias 84 may be formed to respective signal terminal pads 102 and individual power and ground terminal pads 103 may include more or less than four vias 84 based on the dimensions of the given terminal pad 102, 103 and design specifications. Vias 84 are subsequently cleaned such as through a reactive ion etching (RIE) desoot process or laser process.

The manufacturing technique continues by forming and patterning the conductive wiring layer 64 of the base interconnect layer 58 atop insulating layer 62 and into vias 84 thereby forming the sets of parallel conductive vias 66A illustrated in FIG. 14. Conductive wiring layer 64 may be formed using any of the same techniques and materials as described for conductive layer 98 (FIGS. 8 and 9). A sectional view of a portion of the intermediate package structure of FIG. 14 is provided in FIG. 14A to illustrate one exemplary and non-limiting arrangement of conductive wiring layer 64 of the base interconnect layer 58. In FIG. 14A, conductive wiring layer 64 is patterned to include signal routing traces 105 and power and ground contact pads 107, 109 that serve as catch pads or terminal pads for subsequent sets of parallel conductive vias 66B formed in the overlying rerouting interconnect layer 60.

Referring now to FIG. 15, after the conductive wiring layer 64 of the base interconnect layer 58 is complete, a first rerouting interconnect layer 60 is formed atop base interconnect layer 58 using known techniques such as, for example, application of a spun on or flowable film followed by sputtering, plating, and a lithography process. The sectional view provided in FIG. 15A illustrates one exemplary configuration of a portion of conductive wiring layer 64 in which the conductive wiring layer 64 is patterned to include a number of power and ground contact pads 111, 113 that are electrically coupled to the underlying power and ground contact pads 107, 109 of the base interconnect layer 58 by way of sets of parallel conductive vias 66B. In alternative embodiments the conductive wiring layer 64 of the first rerouting interconnect layer 60 is patterned to form external or module I/O pads 70. While FIG. 15A depicts four conductive vias 66B formed to each of the underlying power and ground contact pads 107, 109, the first rerouting interconnect layer 60 may include more or less than four conductive vias 66B per power and ground contact pad 107, 109 based on the dimensions of the given contact pad 107, 109 and design specifications.

One or more additional rerouting interconnect layers 60 may be subsequently formed atop the first rerouting interconnect layer 60 in subsequent steps of the build-up process. The conductive wiring layer 64 on the topmost rerouting interconnect layer 58 or 60 is patterned to form module I/O pads 70. Thereafter, optional solder bumps or solder balls 74 (shown in phantom) may be formed on or attached to the module I/O pads 70 to yield the embedded chip package 106 of FIG. 10.

One skilled in the art will recognize that alternative materials and process steps could be used to form the embedded chip package 106 of FIG. 10. For example, reconfigured semiconductor logic device 104 could be molded into insulating material 76 prior to bonding the device 104 to the insulating layer 62. In such an embodiment, base interconnect layer 58 would be laminated over the reconfigured semiconductor logic device 104 and the upper surface 206 of the insulating material 76.

Figure 16:
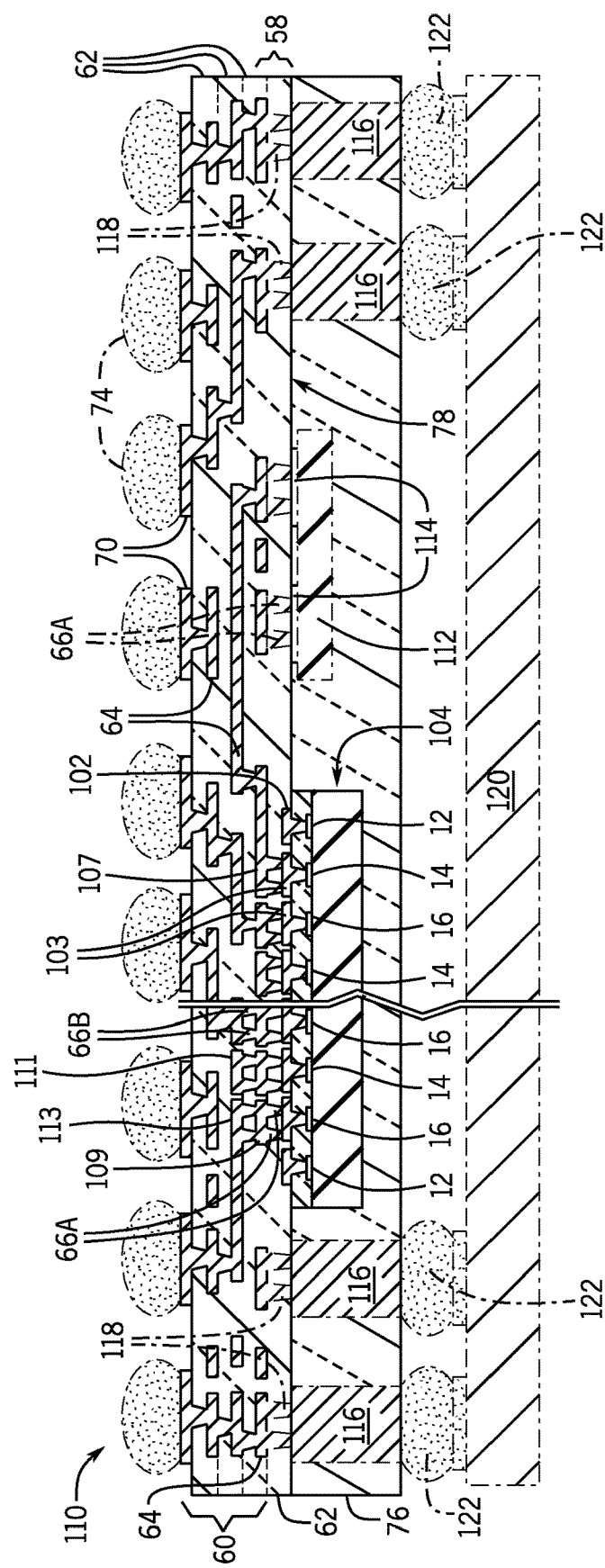
FIG. 16 is a schematic cross-sectional view of an electronic package including a reconfigured semiconductor logic device, according to another embodiment of the invention.

Referring now to FIG. 16, an embedded multichip module 110 is illustrated according to an embodiment of the invention. Embedded multichip module 110 includes reconfigured semiconductor logic device 104 and at least one additional component. FIG. 16 contains a number of elements similar to those described above with respect to FIGS. 10-15, which are referred to with common part numbering with respect to FIG. 16.

Similar to embedded chip package 106 of FIG. 10, embedded multichip module 110 includes a reconfigured semiconductor logic device 104 attached to the bottom surface 78 of the insulating layer 62 of base interconnect layer 58 and embedded in a cavity within insulating material 76. In some embodiments, embedded multichip module 110 also includes at least one additional microelectronics device 112 (shown in phantom) embedded within a second cavity within insulating material 76 adjacent reconfigured semiconductor logic device 104. According to exemplary embodiments, microelectronics device 112 may be a semiconductor device, a passive device, a MEMS device, an acoustic device, or other type of electrical component. The conductive wiring layer 64 of the base interconnect layer 58 is electrically coupled to the terminal pads 102, 103 of reconfigured semiconductor logic device 104 and to contact pads 114 of microelectronics device 112. In the illustrated embodiment, embedded multichip module 110 includes three additional rerouting interconnect layers 60 formed atop base interconnect layer 58. However, more or less rerouting interconnect layers 60 may be included in alternative embodiments based on the desired I/O routing structure and module complexity.

Similar to the configuration described with respect to FIGS. 10-15, base interconnect layer 58 includes conductive vias 66A that form parallel electrical connections between one or more of the power and ground terminal pads 103 of reconfigured semiconductor logic device 104 and the power and ground contact pads 107, 109 of conductive wiring layer 64. In some embodiments, the overlying rerouting interconnect layer 60 also includes conductive vias 66B that form parallel conductive paths between a respective power or ground contact pad 107, 109 of base interconnect layer 58 and a respective power or ground contact pad 111, 113 of the first rerouting interconnect layer 60. While not illustrated in FIG. 16, it is contemplated that any additional rerouting interconnect layers 60 may include similar parallel conductive vias 66.

Optionally, embedded multichip module 110 includes one or more electrically conductive connections, through connectors or through molding vias (TMVs) 116 (shown in phantom), which are formed through the thickness of insulating material 76 and bring selected signals, power, and ground connections to the bottom surface of the insulating material 76 to facilitate connection to other circuitry. Through connectors 116 are preferably metal such as, for example, copper, aluminum, or stainless steel, but may be any type of electrically conductive material in alternative embodiments. Through connectors 116 may be formed by any known technique such as electroless plating and/or electroplating for example. Each of these through connectors 116 are electrically coupled to conductive wiring layer 64 by way of one or more metalized vias 118 (also shown in phantom).

Embedded multichip module 110 may also include an optional second microelectronics package 120 (shown in phantom) mounted to the through connectors 116 with optional solder balls 122 (shown in phantom) to form a package-on-package structure. Microelectronics package 120 may include one semiconductor device or multiple semiconductor devices such as, for example, a stack of memory chips within an area array package. Microelectronics package 120 may be mounted to one or more of the module I/O pads 70 in an alternative embodiment.

FIGS. 17-19 depict an alternative method of embedding a reconfigured semiconductor logic device 104, according to an embodiment of the invention. Referring first to FIG. 17, the method begins by coating a plate or platen 200 with a layer of temporary adhesive or bonding material 202. The singulated reconfigured semiconductor logic device 104 is placed active surface 204 down onto the layer of temporary bonding material 202 as shown in FIG. 18. Next, molding resin or insulating material 76 is dispensed to embed the device 104 and exposed portions of the temporary bonding material 202. In some embodiments, insulating material 76 is dispensed in a manner that leaves the backside of the device 40 exposed. Insulating material 76 can be dispensed by one of injection molding, compression molding, pour molding and fluid jetting, as non-limiting examples. After curing insulating material 76, the combined assembly of cured insulating material 76 and device 104 is removed from the temporary bonding material 202 and platen 200. As shown in FIG. 19, the active surface 204 of device 104 is co-planar or substantially co-planar with the top surface 206 of the cured insulating material 76. At this point, one or more interconnect layers 58, 60 can be formed over the device 104 and the top surface 206 of insulating material 76.

The above-described embodiments leverage the larger footprint of the terminal pads 103 on the reconfiguration layer 88 to provide a contact surface for a set of multiple conductive vias 66, which form parallel electrical connections to the power and ground I/Os of a semiconductor logic device. The concept of these parallel electrical connections can also be extended to electronics packages that include semiconductor logic devices with enlarged ground and power I/O pads, such as the semiconductor logic device 40 of FIG. 4, without a reconfiguration layer formed over the device. FIG. 20 illustrates an embedded electronics package 124 according to one such embodiment. Components common to electronics package 124 and electronics package 106 (FIG. 10) are referred to with common reference numbers.

As shown in FIG. 20, semiconductor logic device 40 is embedded within a cavity formed in insulating material 76 such that the active surface 42 of device 40 is coplanar or substantially coplanar with the top surface 206 of insulating material 76. The insulating layer 62 of the base interconnect layer 58 is formed over the top surface 206 of insulating material 76 and the active surface 42 of semiconductor logic device 40. The parallel conductive vias 66 of the base interconnect layer 58 extend through the insulating layer 62 to contact the enlarged power and ground I/O pads 14, 16 of the semiconductor logic device 40. One exemplary arrangement of these parallel conductive vias 66 is provided in FIG. 20A, which includes a set of four conductive vias 66 formed between each respective power and ground I/O pad 14, 16 and power and ground terminal pads 107, 109 that are formed in the overlying conductive wiring layer 64. Any number of parallel conductive vias 66 may be formed to respective power and ground I/O pads 14, 16 in alternative embodiments.

Beneficially, the larger I/O pads formed at the device-level and/or the larger terminal pads formed on the reconfiguration layer in alternative embodiments allow the formation of multiple conductive vias to a common terminal pad or I/O pad. These multiple conductive vias provide increased conductivity and redundant, parallel electrical connections between the interconnect structure and respective I/O pads on the semiconductor logic device, thereby increasing layer-to-layer conductivity and interconnect yields associated with interconnect defects. The increased size of the larger I/O pads and/or terminal pads formed to the I/O pads also provide the respective contact points with higher current carrying capability and permits the device to be designed with a smaller footprint than capable for flip chip or wire bond assembly, thereby increasing the number of die per wafer and thus lowering fabrication costs. The larger I/O pads and/or terminal pads also lower interconnect parasitics within the embedded chip module.

Embodiments of this invention also provide the capability of reducing the die size of a complex, high I/O count semiconductor logic device by reducing the pad pitch below the minimum solderable pitch when redesigning the device for a smaller feature size semiconductor fabrication node. In the case of a typical 10-15% feature size reduction, embodiments of the invention permit a semiconductor logic chip to be designed with a 20-30% die size reduction and a potential 15-20% reduction in wafer fabrication costs.

On the package-level, embodiments of the invention provide for higher power delivery and higher semiconductor logic device performance than state-of-the-art flip chip solder bump approaches, including a ten-fold reduction in interconnect resistance, a ten-fold increase in current carrying capability and a thinner package as compared with flip chip solder bump. The electrical interconnections to the I/O pads 12, 14, 16 of semiconductor logic device 40 are not susceptible to solder fatigue, electro-migration, or pad-to-pad solder shorts since they are formed without solder. Further, use of embedded chip assembly permits a complex semiconductor logic device with thousands of I/O pads to undergo a die shrink without losing electrical performance. Embodiments of the invention disclosed herein also provide higher electrically performance and higher interconnect yield than prior art embedded semiconductor chip packages, with a four-fold reduction in interconnect resistance, and a four-fold increase in current carrying capability compared to other embedded chip approaches. Accordingly, the embodiments described herein provide a low-cost solution with higher performance as compared to prior art approaches.

Therefore, according to one embodiment of the invention, a reconfigured semiconductor logic device includes a semiconductor logic device comprising an active surface having a plurality of input/output (I/O) pads formed thereon and a redistribution layer. The redistribution layer includes an insulating layer disposed on the active surface of the semiconductor logic device and a patterned conductive layer comprising a plurality of discrete terminal pads formed atop the insulating layer. The plurality of discrete terminal pads are electrically coupled to respective I/O pads of the plurality of I/O pads by conductive vias formed through the insulating layer. The plurality of discrete terminal pads are larger than the plurality of I/O pads.

According to another embodiment of the invention, a method of manufacturing a reconfigured semiconductor logic device includes forming an insulating layer on an active surface of a semiconductor logic device and forming a plurality of vias through the insulating layer to expose a plurality of input/output (I/O) pads on the active surface. The method also includes disposing a conductive material on a top surface of the insulating layer and into the plurality of vias and patterning the conductive material to form a plurality of electrically isolated terminal pads electrically coupled to respective I/O pads of the plurality of I/O pads through the plurality of vias. The plurality of electrically isolated terminal pads are larger than the respective I/O pads.

According to yet another embodiment of the invention, an electronics package includes a reconfigured semiconductor device comprising a semiconductor device and a reconfiguration layer. The reconfiguration layer includes an insulating layer covering an active surface of the semiconductor device having a plurality of input/output (I/O) pads located thereon. The reconfiguration layer also includes a plurality of discrete terminal pads electrically coupled to the plurality of I/O pads through the insulating layer, the plurality of discrete terminal pads being larger than the plurality of I/O pads. The electronics package also includes a multi-layer interconnect structure having a first interconnect insulating layer formed atop the reconfiguration layer and a first conductive wiring layer plated on a top surface of the first interconnect insulating layer. The first conductive wiring layer extends through a plurality of sets of parallel vias formed through the first interconnect insulating layer to contact the plurality of discrete terminal pads. Each set of parallel vias is aligned above a respective terminal pad of the plurality of discrete terminal pads.

According to yet another embodiment of the invention, a method of manufacturing an electronics package includes coupling a top surface of a reconfigured semiconductor device to a first surface of a base insulating layer, the reconfigured semiconductor device comprising a redistribution insulating layer formed over an active surface of a semiconductor device and a plurality of discrete terminal pads formed on the redistribution insulating layer and extending therethrough to couple with a plurality of input/output (I/O) pads located on the active surface, the plurality of discrete terminal pads larger than the plurality of I/O pads. The method also includes forming a plurality of sets of parallel vias through the base insulating layer, each set of parallel vias formed to a respective terminal pad of the plurality of discrete terminal pads. The method further includes forming a conductive wiring layer atop the base insulating layer, the conductive wiring layer electrically coupled to respective terminal pads of the plurality of discrete terminal pads through a set of parallel vias of the plurality of sets of parallel vias.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A reconfigured semiconductor logic device comprising:
   a semiconductor logic device comprising an active surface having a plurality of input/output (I/O) pads formed thereon; and
   a redistribution layer comprising:
      an insulating layer disposed on the active surface of the semiconductor logic device; and
      a patterned conductive layer comprising a plurality of discrete terminal pads formed atop the insulating layer, wherein the plurality of discrete terminal pads are electrically coupled to respective I/O pads of the plurality of I/O pads by conductive vias formed through the insulating layer, and wherein the plurality of discrete terminal pads are larger than the plurality of I/O pads;
   wherein the plurality of discrete terminal pads comprise:
      a plurality of signal terminal pads electrically coupled to signal I/O pads of the plurality of I/O pads;
      a plurality of power terminal pads electrically coupled to power I/O pads of the plurality of I/O pads; and
      a plurality of ground terminal pads electrically coupled to ground I/O pads of the plurality of I/O pads.

2. The reconfigured semiconductor logic device of claim 1 wherein the plurality of power terminal pads and the plurality of ground terminal pads are larger than the plurality of signal terminal pads.

3. The reconfigured semiconductor logic device of claim 1 wherein the plurality of I/O pads are formed on the active surface of the semiconductor logic device at a non-solderable pitch.

4. The reconfigured semiconductor logic device of claim 1 wherein the plurality of I/O pads are formed on the active surface of the semiconductor logic device at a pitch less than or equal to 130 microns.

5. The reconfigured semiconductor logic device of claim 1 wherein the redistribution layer does not extend beyond an outer perimeter of the active surface of the semiconductor logic device.

6. A method of manufacturing a reconfigured semiconductor logic device comprising:
   forming an insulating layer on an active surface of a semiconductor logic device;
   forming a plurality of vias through the insulating layer to expose a plurality of input/output (I/O) pads on the active surface;
   disposing a conductive material on a top surface of the insulating layer and into the plurality of vias; and
   patterning the conductive material to form a plurality of electrically isolated terminal pads electrically coupled to respective I/O pads of the plurality of I/O pads through the plurality of vias, the plurality of electrically isolated terminal pads larger than the respective I/O pads;
   wherein forming the plurality of electrically isolated terminal pads comprises:
      forming a first subset of the plurality of electrically isolated terminal pads to electrically couple to signal I/O pads of the plurality of I/O pads; and
      forming a second subset of the plurality of electrically isolated terminal pads to electrically couple to power and ground I/O pads of the plurality of I/O pads, the second subset of the plurality electrically isolated terminal pads larger than the first subset.

7. An electronics package comprising:
   a reconfigured semiconductor device comprising:
      a semiconductor device; and
      a reconfiguration layer comprising:
         an insulating layer covering an active surface of the semiconductor device having a plurality of input/output (I/O) pads located thereon; and
         a plurality of discrete terminal pads electrically coupled to the plurality of I/O pads through the insulating layer, the plurality of discrete terminal pads being larger than the plurality of I/O pads; and
   a multi-layer interconnect structure comprising:
      a first interconnect insulating layer formed atop the reconfiguration layer; and a first conductive wiring layer plated on a top surface of the first interconnect insulating layer, the first conductive wiring layer extending through a plurality of sets of parallel vias formed through the first interconnect insulating layer to contact the plurality of discrete terminal pads, wherein each set of parallel vias is aligned above a respective terminal pad of the plurality of discrete terminal pads.

8. The electronics package of claim 7 wherein the first conductive wiring layer comprises a plurality of contact pads, and wherein a respective contact pad of the plurality of contact pads is electrically coupled to a respective terminal pad of the plurality of discrete terminal pads through a set of parallel vias of the plurality of sets of parallel vias.

9. The electronics package of claim 7 further comprising an insulating material surrounding side surfaces of the reconfigured semiconductor device and an exposed bottom surface of the multi-layer interconnect structure.

10. The electronics package of claim 9 wherein the reconfigured semiconductor device is embedded within the insulating material.

11. The electronics package of claim 9 further comprising an electrical component embedded within the insulating material adjacent the semiconductor device and electrically coupled to the multi-layer interconnect structure.

12. The embedded electronics package of claim 9 further comprising a plurality of electrically conductive connections that extend from a top surface of the insulating material to a bottom surface of the insulating material; and
wherein the first conductive wiring layer electrically connects to the plurality of electrically conductive connections.

13. The electronics package of claim 7 wherein the plurality of discrete terminal pads have a larger surface area than the plurality of I/O pads.

14. The electronics package of claim 7 wherein the first conductive wiring layer is electrically coupled to one of a power I/O pad and a ground I/O pad of the plurality of I/O pads through a set of parallel vias of the plurality of sets of parallel vias.

15. The electronics package of claim 7 wherein the insulating layer does not extend beyond an outer perimeter of the active surface of the semiconductor device.

16. The electronics package of claim 7 wherein the multi-layer interconnect structure further comprises:
a second interconnect insulating layer formed over the first interconnect insulating layer and the first conductive wiring layer; and
a second conductive wiring layer formed on a top surface of the second interconnect insulating layer, the second conductive wiring layer extending through a plurality of sets of parallel vias formed through the second interconnect insulating layer to electrically couple the second conductive wiring layer to the first conductive wiring layer.

17. The electronics package of claim 7 wherein the semiconductor device comprises a semiconductor logic device.

18. The electronics package of claim 17 wherein the plurality of I/O pads are formed at a non-solderable pitch.

* * * * *